(12) United States Patent
Ueno et al.

(10) Patent No.: US 8,310,873 B2
(45) Date of Patent: Nov. 13, 2012

(54) NON-VOLATILE SEMICONDUCTOR MEMORY DEVICE

(75) Inventors: Koki Ueno, Yokohama (JP); Hiroyuki Nagashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/232,163

(22) Filed: Sep. 14, 2011

(65) Prior Publication Data

US 2012/0002475 A1    Jan. 5, 2012

Related U.S. Application Data

(63) Continuation of application No. 12/397,808, filed on Mar. 4, 2009, now Pat. No. 8,081,512.

(30) Foreign Application Priority Data

Apr. 28, 2008 (JP) ................................. 2008-117729

(51) Int. Cl.
*G11C 11/34* (2006.01)
(52) U.S. Cl. ......... 365/185.11; 365/185.18; 365/185.25; 365/185.29
(58) Field of Classification Search ............. 365/185.11, 365/185.18, 185.25, 185.29
See application file for complete search history.

(56) References Cited

U.S. PATENT DOCUMENTS

| | | | |
|---|---|---|---|
| 5,737,742 A | 4/1998 | Achiwa et al. | |
| 6,341,085 B1 | 1/2002 | Yamagami et al. | |
| 7,916,543 B2 * | 3/2011 | Goda et al. | 365/185.17 |
| 2005/0111259 A1 | 5/2005 | Fukuda et al. | |
| 2008/0106939 A1 | 5/2008 | Yamagami et al. | |
| 2008/0159046 A1 | 7/2008 | Rinerson et al. | |
| 2008/0279027 A1 | 11/2008 | Boeve | |
| 2008/0298123 A1 | 12/2008 | Mihnea et al. | |
| 2009/0161430 A1 | 6/2009 | Allen et al. | |
| 2010/0180073 A1 | 7/2010 | Weingarten et al. | |
| 2010/0207189 A1 | 8/2010 | Kellam | |
| 2010/0325353 A1 | 12/2010 | Kim | |

FOREIGN PATENT DOCUMENTS

| | | |
|---|---|---|
| JP | 1-162359 | 6/1989 |
| JP | 8-7597 | 1/1996 |
| JP | 8-203292 | 8/1996 |

(Continued)

OTHER PUBLICATIONS

Korean Office Action issued Oct. 15, 2010, in Patent Application No. 10-2009-0036434 (with English language translation).

(Continued)

*Primary Examiner* — Fernando Hidalgo
(74) *Attorney, Agent, or Firm* — Oblon, Spivak, McClelland, Maier & Neustadt, L.L.P.

(57) ABSTRACT

A non-volatile semiconductor memory device includes a non-volatile memory having a plurality of blocks each including a plurality of memory cells, a bit line electrically connected to one end of a current path of the memory cell, a source line electrically connected to the other end of the current path of the memory cell, a word line electrically connected to the gate electrode, a sense amplifier circuit electrically connected to the bit line and configured to read data from the memory cell, a row decoder electrically connected to the word line and configured to apply a read voltage at which the memory cell is set to an ON state to the word line, and a controller configured to measure a cell current flowing through the memory cell in the ON state to judge whether the memory cell has been degraded.

14 Claims, 17 Drawing Sheets

FOREIGN PATENT DOCUMENTS

| | | |
|---|---|---|
| JP | 9-330598 | 12/1997 |
| JP | 10-255487 | 9/1998 |
| JP | 2000-215697 | 8/2000 |
| JP | 2004-296012 | 10/2004 |
| JP | 2006-286118 | 10/2006 |
| KR | 10-0271701 | 11/2000 |
| KR | 10-2004-0008532 | 1/2004 |
| KR | 10-2005-0050148 | 5/2005 |
| KR | 10-2005-0059314 | 6/2005 |
| KR | 10-2005-0067203 | 6/2005 |
| KR | 10-0624590 | 9/2006 |
| KR | 10-2006-0130018 | 12/2006 |
| KR | 10-2007-0012582 | 1/2007 |
| KR | 10-0725979 | 6/2007 |
| KR | 10-2009-0032246 | 4/2009 |

OTHER PUBLICATIONS

Office Action issued May 31, 2011 in Korean Patent Application No. 10-2009-36434 (with English translation) 6 pages.

U.S. Appl. No. 13/424,788, filed Mar. 20, 2012, Ueno.

Office Action mailed Sep. 4, 2012, in Japanese Patent Application No. 2008-117729, filed Apr. 28, 2008, (w/English translation), pp. 1-5.

* cited by examiner

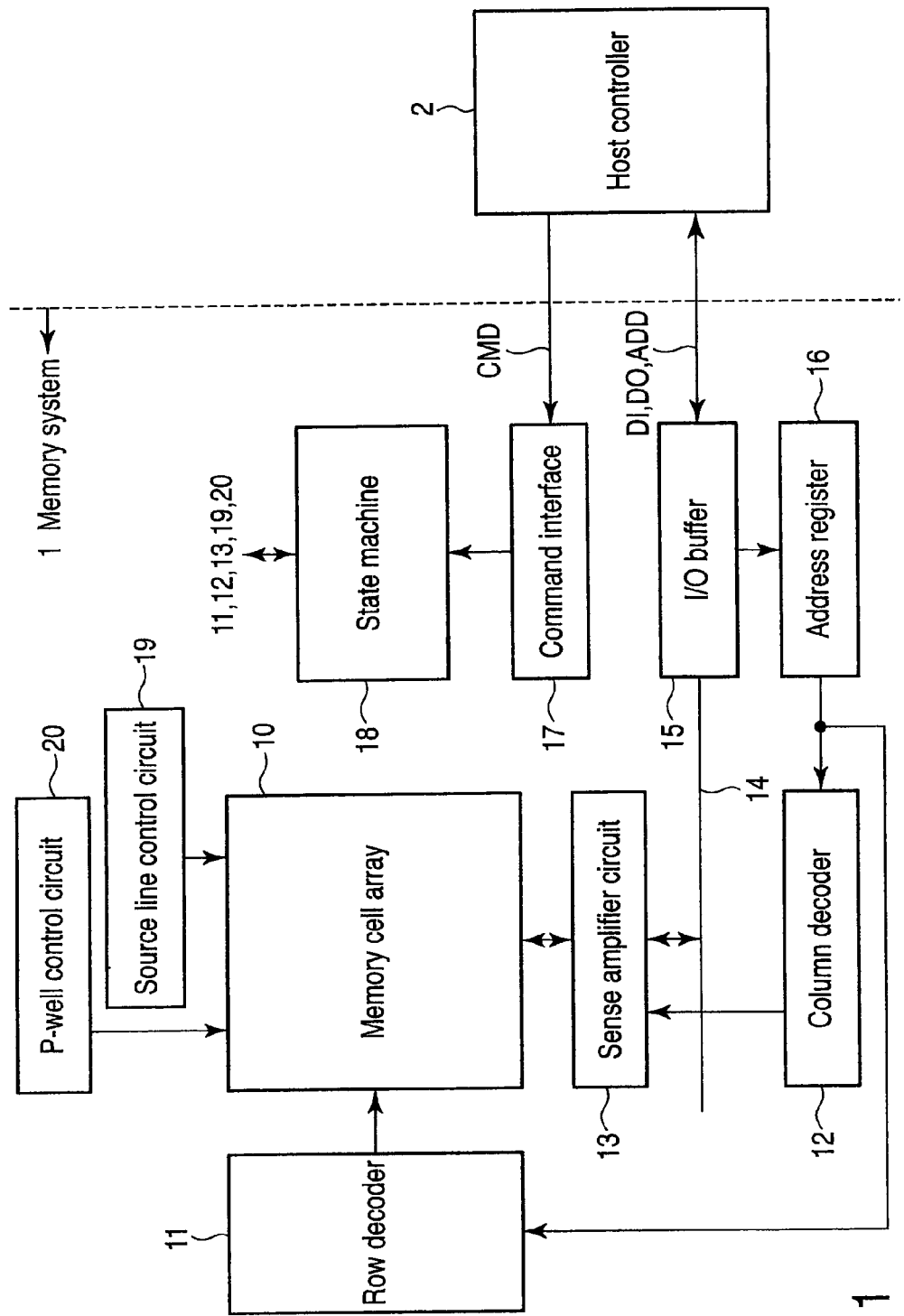
F I G. 1

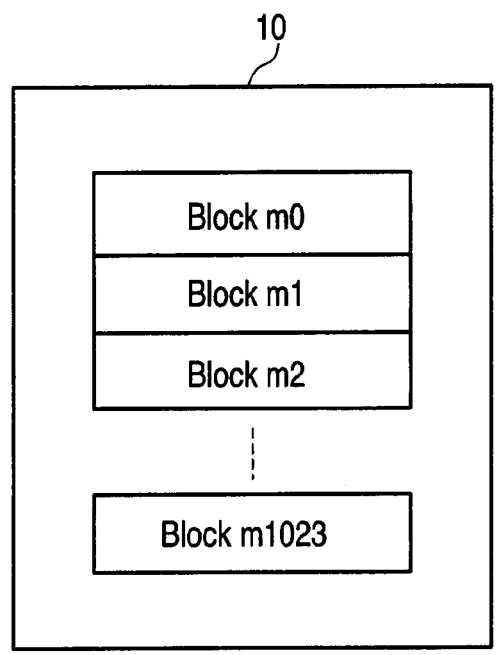
F I G. 2
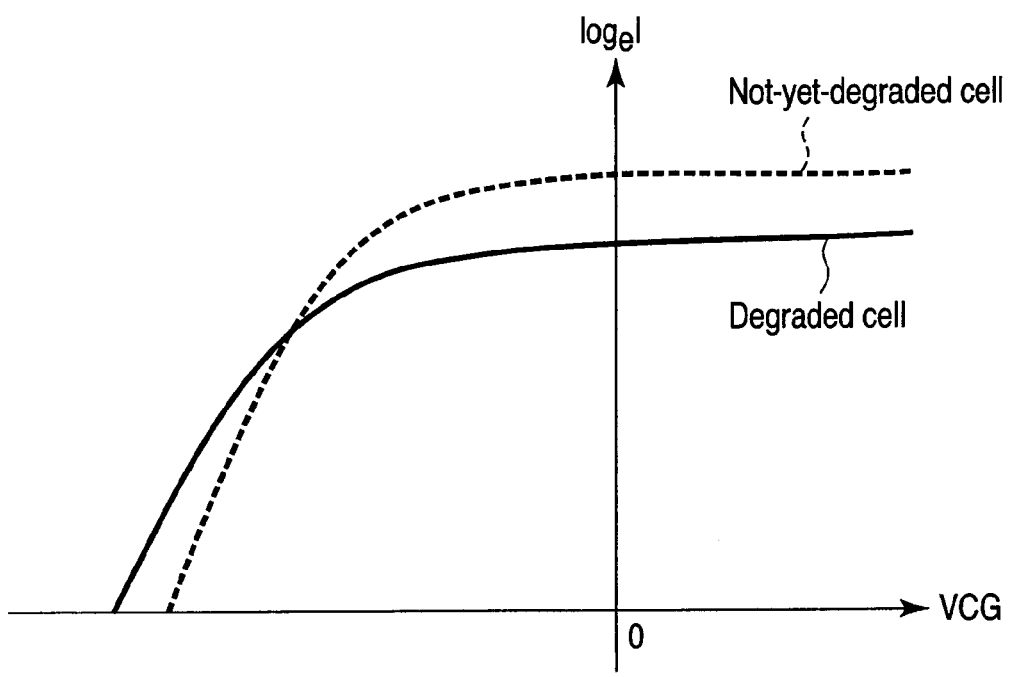
F I G. 6

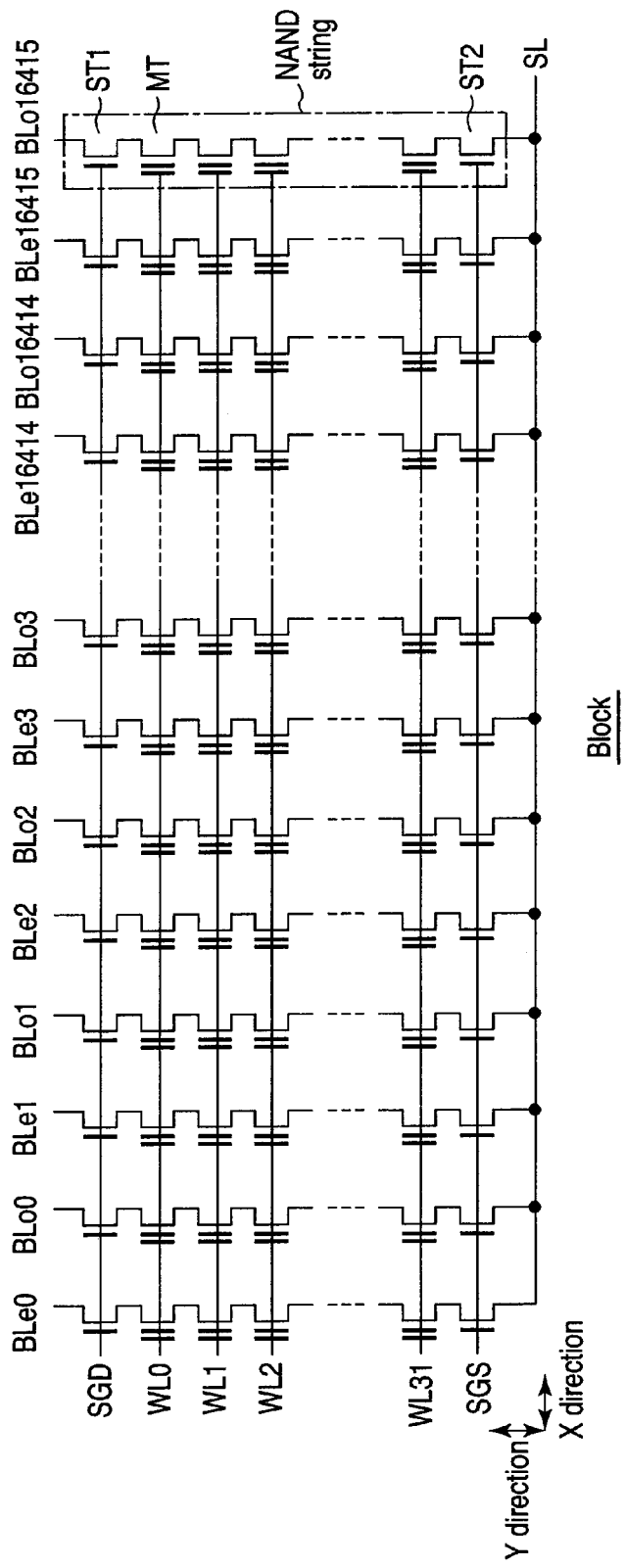
F I G. 3

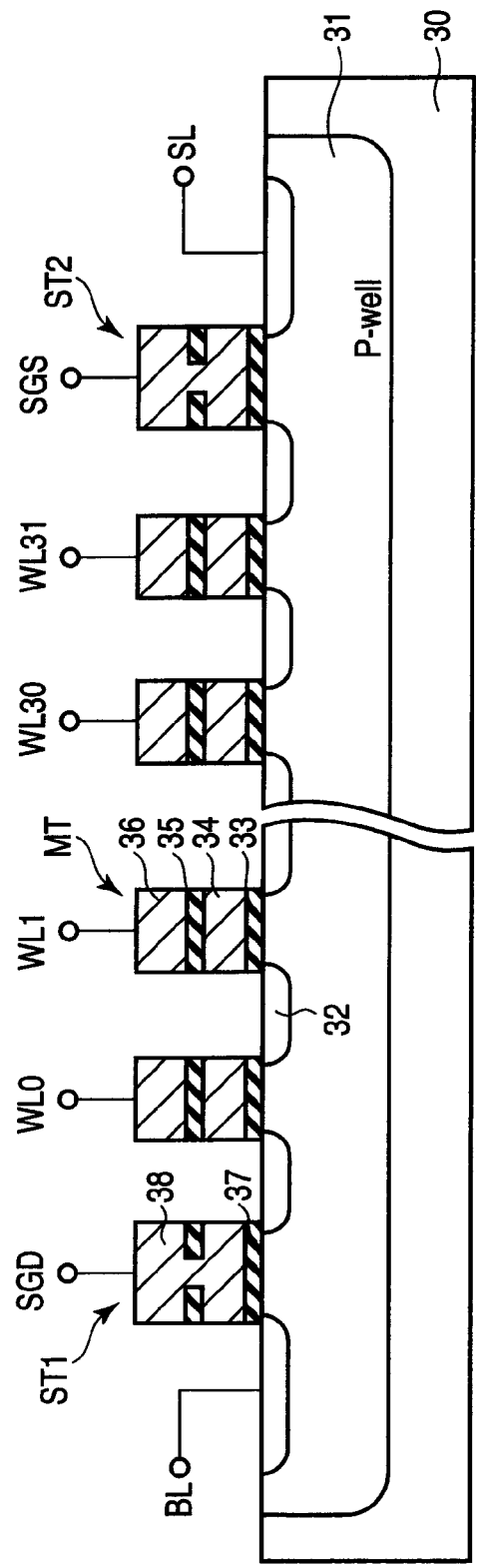
F I G. 4

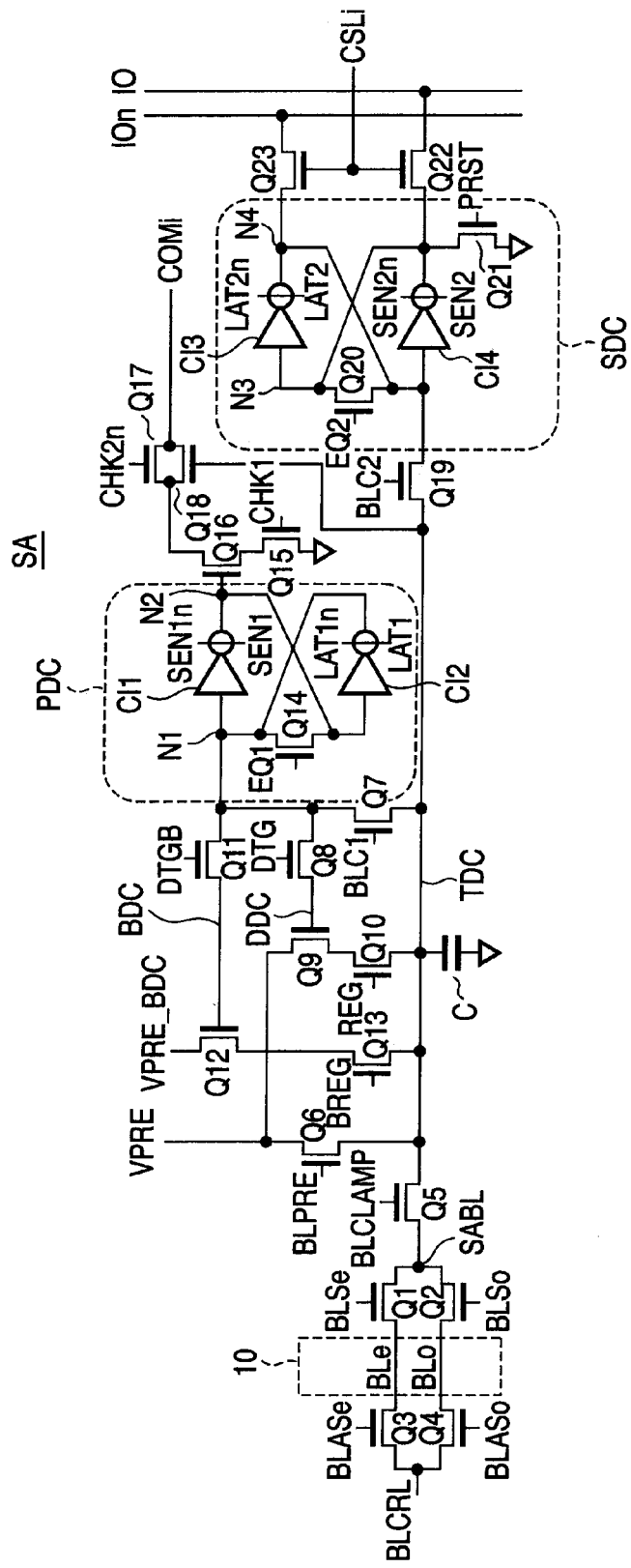
F I G. 5

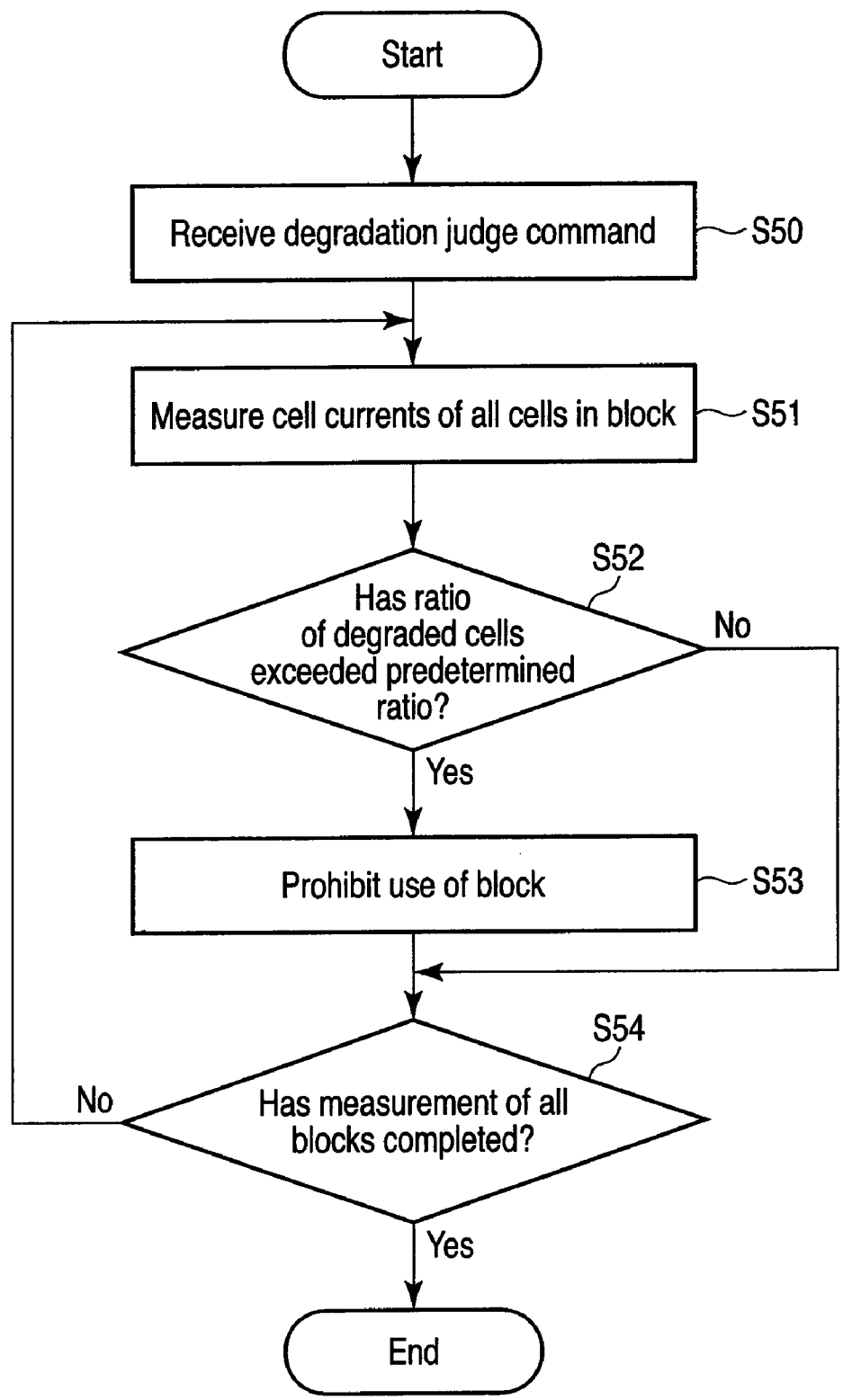
F I G. 16

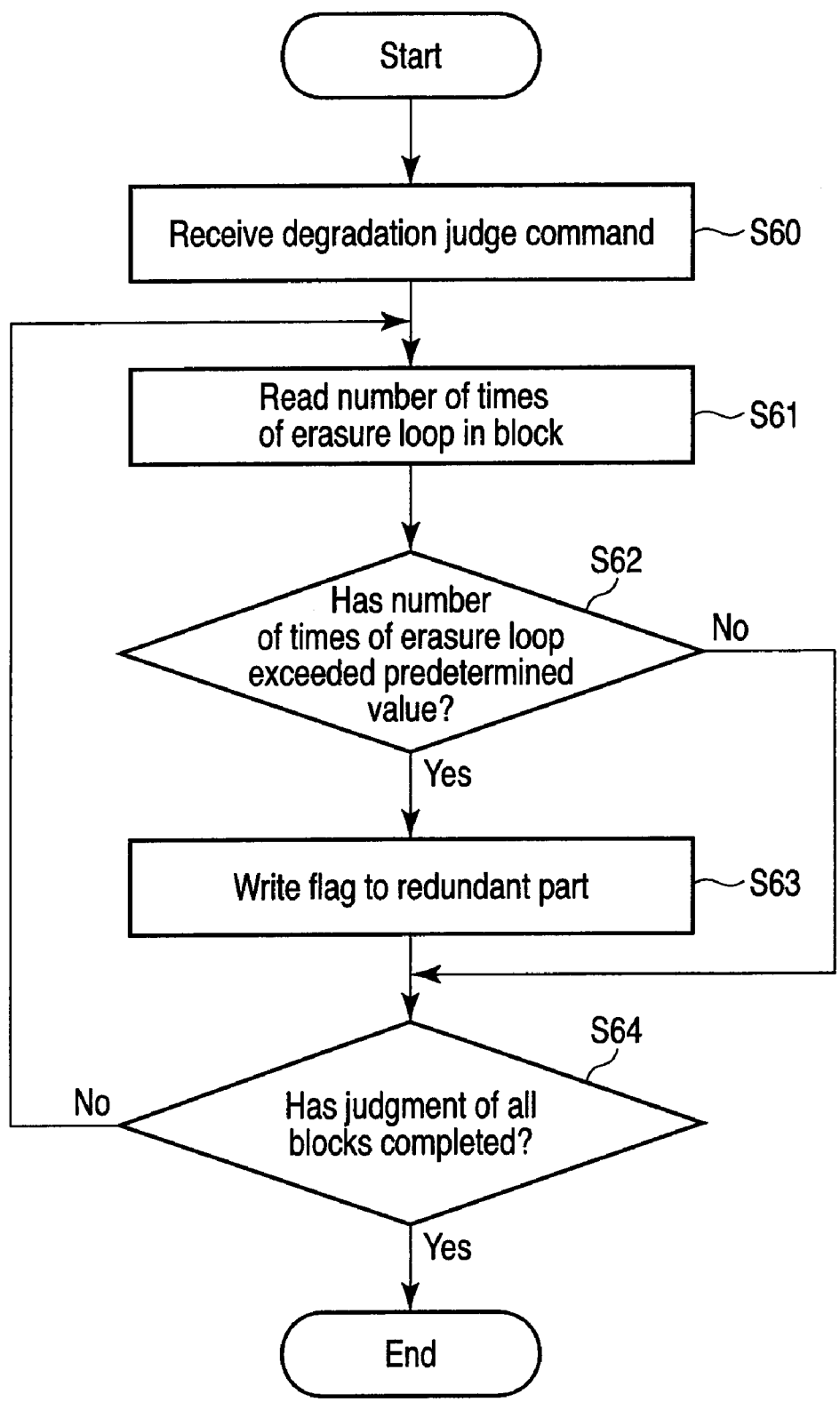
F I G. 17

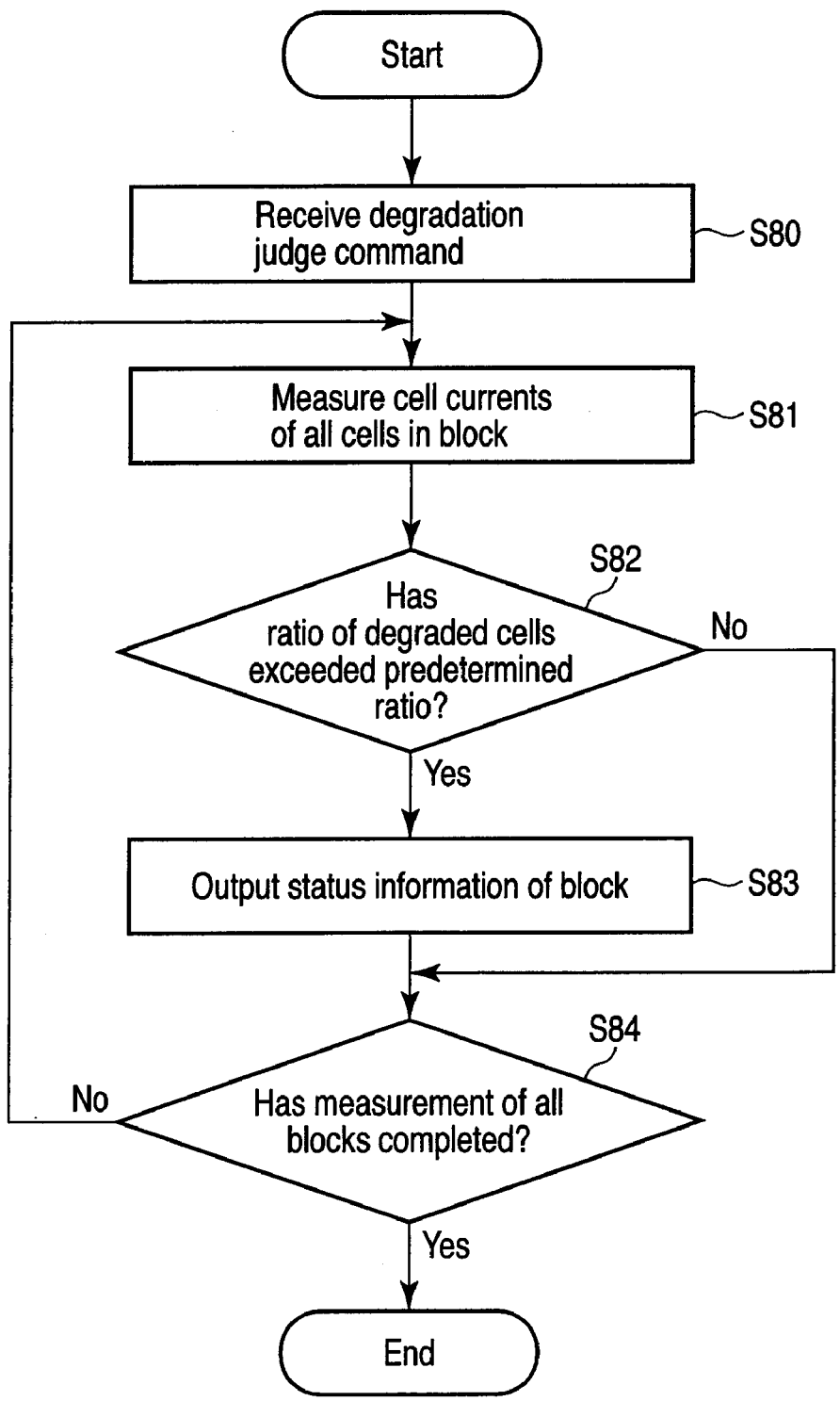
F I G. 19

NON-VOLATILE SEMICONDUCTOR MEMORY DEVICE

CROSS-REFERENCE TO RELATED APPLICATIONS

This application is a continuation of U.S. application Ser. No. 12/397,808 filed on Mar. 4, 2009, and is based upon and claims the benefit of priority from prior Japanese Patent Application No. 2008-117729, filed Apr. 28, 2008, the entire contents of each of which are incorporated herein by reference.

BACKGROUND OF THE INVENTION

1. Field of the Invention

The present invention relates to a non-volatile semiconductor memory device including, for example, a non-volatile semiconductor memory device which can be electrically rewritten.

2. Description of the Related Art

As a non-volatile semiconductor memory which can be electrically rewritten, a NAND flash memory is known. The NAND flash memory comprises a memory cell transistor having a stacked gate structure in which a tunnel insulation film, a charge storage layer, an intergate insulation film, and a control gate electrode are sequentially stacked on a semiconductor substrate.

With this structure, the memory cell transistor may be degraded by an increase in electrons trapped in the tunnel insulation film caused by repeated rewriting. With a higher threshold voltage, the degraded memory cell transistor will have a higher write speed, thus increasing the possibility of an over-program condition (failure of being biased above a desired threshold voltage as a result of writing). Further, with the trapped electrons detrapped by being left at a high temperature, the degraded memory cell transistor is biased far below the threshold voltage, and thereby decreases in data retention characteristics.

A current NAND flash memory is provided with a margin for write/read setting, such that a proper operation is guaranteed even in such a degraded memory cell transistor. Set to guarantee a proper operation even in a degraded memory cell transistor, a memory cell transistor deteriorates in performance in a state where degradation is rarely found, for example, immediately after the product is shipped. Considering that there is a case where degradation of a memory cell transistor recovers by increasing the time interval of rewriting at a high temperature, the degree of degradation of a memory cell transistor after being rewritten thousands of times or several tens of thousands of times greatly varies depending on conditions.

Further, in order to guarantee data retention characteristics after being rewritten thousands of times or several tens of thousands of times, the NAND flash memory is subjected to a reliability assessment before being shipped. For example, in order to estimate the duration of a NAND flash memory, for example, hundreds of hours of reliability assessment must be performed. It is therefore very difficult to monitor reliability quickly during process change or commercial production.

As a related technique of this kind, "Jpn. Pat. Appln. KOKAI Publication No. 8-7597" discloses the technique as will be described below. After data writing/erasure to/from a memory cell transistor, verification reading is performed to verify whether the data writing/erasure has been performed properly. The data writing/erasure and the verification reading operations are repeated for a predetermined number of times until the data writing/erasure is performed properly. If the proper data writing/erasure is not performed even after the operations are performed for the predetermined number of times, it is judged that the memory cell transistor has degraded, and a redundant memory cell transistor is selected instead of the degraded memory cell transistor.

BRIEF SUMMARY OF THE INVENTION

According to an aspect of the present invention, there is provided a non-volatile semiconductor memory device comprising: a non-volatile memory having a plurality of blocks each including a plurality of memory cells, each of the memory cells having a stacked gate structure in which a first insulation film, a charge storage layer, a second insulation film, and a gate electrode are sequentially stacked; a bit line electrically connected to one end of a current path of the memory cell; a source line electrically connected to the other end of the current path of the memory cell; a word line electrically connected to the gate electrode; a sense amplifier circuit electrically connected to the bit line and configured to read data from the memory cell; a row decoder electrically connected to the word line and configured to apply a read voltage at which the memory cell is set to an ON state to the word line; and a controller configured to measure a cell current flowing through the memory cell in the ON state to judge whether the memory cell has been degraded.

According to an aspect of the present invention, there is provided a non-volatile semiconductor storage device, comprising: a non-volatile memory having a plurality of blocks each including a plurality of memory cells, each of the memory cells having a stacked gate structure in which a first insulation film, a charge storage layer, a second insulation film, and a gate electrode are sequentially stacked on a semiconductor substrate; and a controller configured to erase data in the memory cell by discharging the charge storage layer, and judge that a block has been degraded when the number of times of erasure operations to erase all data in the block exceeds a predetermined number.

According to an aspect of the present invention, there is provided a non-volatile semiconductor memory device comprising: a non-volatile semiconductor memory having a plurality of blocks each including a plurality of memory cells, each of the memory cells having a stacked gate structure in which a first insulation film, a charge storage layer, a second insulation film, and a gate electrode are sequentially stacked; and a controller configured to write data to the memory cell by injecting charge to the charge storage layer, and judge that a block has been degraded when the number of times of write operations to write all data to the block is below a predetermined number.

BRIEF DESCRIPTION OF THE SEVERAL VIEWS OF THE DRAWING

FIG. 1 is a block diagram showing a configuration of a memory system 1 according to a first embodiment of the present invention;

FIG. 2 is a schematic diagram showing a configuration of a memory cell array 10;

FIG. 3 is a circuit diagram showing the configuration of a block included in the memory cell array 10;

FIG. 4 is a cross-sectional view showing a configuration of a NAND string;

FIG. 5 is a circuit diagram showing a configuration of a sense amplifier SA included in a sense amplifier circuit 13;

FIG. 6 shows current/voltage characteristics of a not-yet-degraded cell and a degraded cell;

FIG. 16 is a flowchart showing a block use prohibition setting operation of a memory system 1 according to a fifth embodiment;

FIG. 17 is a flowchart showing a degraded block judge operation of a memory system 1 according to a sixth embodiment;

FIG. 19 is a flowchart showing a degraded block judge operation of a memory system 1 according to an eighth embodiment;

DETAILED DESCRIPTION OF THE INVENTION

Figure 7:
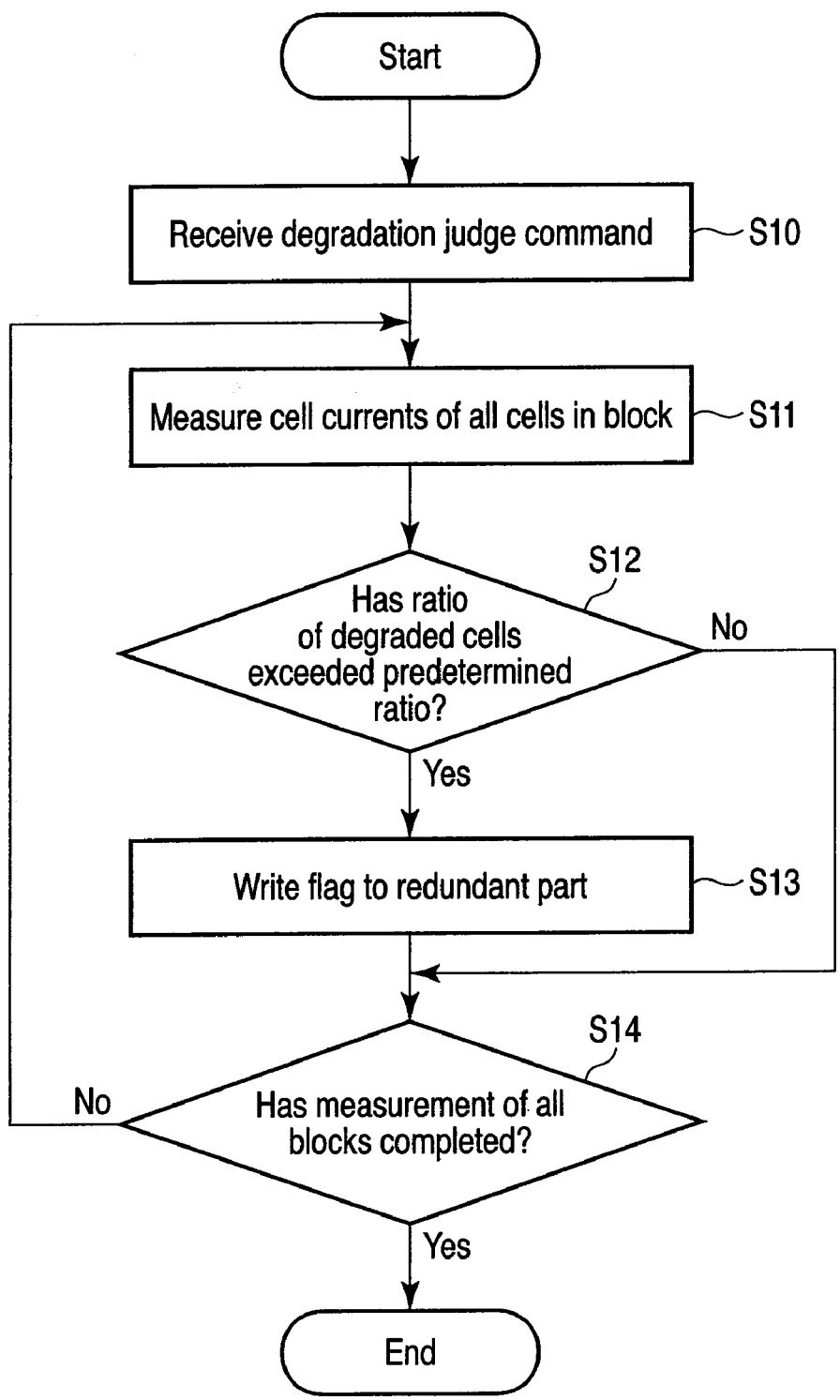
FIG. 7 is a flowchart showing a degraded block judge operation of the memory system 1.

Hereinafter, embodiments of the present invention will now be described with reference to the accompanying drawings. In the descriptions, elements having the same function and configuration will be denoted by the same reference numeral and repeated explanation of them will be made only when necessary.

First Embodiment

[1. Configuration of Memory System 1]

A memory system (non-volatile semiconductor memory device) 1 of the present embodiment is mounted on a printed substrate, for example, on which a host device is mounted, and transfers data to/from the host device via a bus. Alternatively, the memory system 1 of the present invention is configured to be detachable from the host device, and transfers data to/from the host device via a bus in a state of being connected to the host device. FIG. 1 is a block diagram showing a configuration of the memory system 1 according to the first embodiment.

A memory cell array 10 can be electrically rewritten, and is formed of a NAND flash memory, which is a type of non-volatile semiconductor memory. The memory cell array 10 comprises a plurality of blocks, each of which forms a unit of data erasure. The memory cell array 10 is provided with a plurality of word lines WL each extending in a row direction.

Further, the memory cell array 10 is provided with a plurality of bit lines BL each extending in a column direction.

A row decoder 11 performs a row selection (word line selection) of the memory cell array 10, and a column decoder 12 performs a column selection (bit line selection) of the memory cell array 10. A sense amplifier circuit 13 including a data latch is connected to the bit lines BL of the memory cell array 10, and reads data from the memory cell array 10 or write data supplied from an external circuit to the memory cell array 10.

When data is read, data read by the sense amplifier circuit 13 is output to an external circuit (such as a host controller 2) as output data DO via a data bus 14 and an input/output buffer 15. When data is written, input data DI input from the host controller 2 to the memory system 1 is sent to the sense amplifier circuit 13 as write data via the input/output buffer 15 and the data bus 14.

An address ADD supplied from the host controller 2 is held in an address register 16 via the input/output buffer 15. The address ADD held in the address register 16 is sent to the row decoder 11 and the column decoder 12. A command CMD supplied from the host controller 2 is decoded by the command interface 17 and sent to a state machine 18 which is a controller.

The state machine (controller) 18 performs data writing, data reading, and data erasure control operations based on the command CMD supplied according to the operation mode. In order to control these operations, the state machine 18 controls the operations of the row decoder 11, the column decoder 12, the sense amplifier circuit 13, the source line control circuit 19, and a p-well control circuit 20.

The source line control circuit 19 controls a voltage CELSRC of a source line SL provided in the memory cell array 10 according to the operation mode. The p-well control circuit 20 controls the voltage of a plurality of P-type semiconductor regions (P-wells) corresponding to a plurality of blocks forming the memory cell array 10.

FIG. 2 is a schematic diagram showing a configuration of the memory cell array 10. As described above, the memory cell array 10 comprises a plurality of blocks each forming a unit of data erasure. FIG. 2 illustrates a case where the memory cell array 10 comprises 1024 blocks (blocks m0-m1023).

FIG. 3 shows a circuit diagram showing a configuration of one of the blocks included in the memory cell array 10. The one block comprises a plurality of (16416, for example) NAND strings sequentially arranged in an X direction. In a selection transistor ST1 included in each of the NAND strings, a drain is connected to a bit line BL, and a drain is commonly connected to a selection gate line SGD. Further, in a selection transistor ST2 included in each of the plurality of NAND strings, a source is commonly connected to a source line SL, and a gate is connected to a selection gate line SGS.

In each of the NAND strings, a plurality of (32, for example) memory cell transistors MT (hereinafter also referred to as cells) are arranged between the source of the selection transistor ST1 and the drain of the selection transistor ST2 such that the current paths are serially connected in series. That is, the plurality of memory cell transistors MT are connected in series in a Y direction such that adjacent ones share a diffusion region (a source region or a drain region).

Further, control gate electrodes of the memory cell transistors MT are connected to corresponding ones of word lines WL0-WL31, in the order of increasing distance from the drain. That is, a drain of a memory cell transistor MT connected to the word line WL0 is connected to the source of the selection transistor ST1, and the source of a memory cell transistor MT connected to the word line WL31 is connected to the drain of the selection transistor ST2.

FIG. 4 is a cross-sectional view showing a configuration of the NAND string. A P-well 31 is formed in a semiconductor substrate 30. Each of the memory cell transistors MT is formed of a metal oxide semiconductor field effect transistor (MOSFET) having a stacked gate structure formed on the P-well 31. The stacked gate structure is formed on the P-well 31 by sequentially stacking a tunnel insulation film 33, a charge storage layer (floating gate electrode) 34, an intergate insulation film 35, and a control gate electrode 36. A diffusion region 32 is provided in the P-well 31 between adjacent ones of the stacked gate structures.

The threshold voltage of the memory cell transistor MT changes according to the number of electrons stored in the floating gate electrode 34. Data is stored according to the difference in threshold voltage. The memory cell transistor MT may be configured to store binary data (of 1 bit), or may be configured to store multilevel data (of 2 or more bits).

Further, the selection transistor ST1 is formed of a gate insulation film 37 provided on the P-well 31, a gate electrode 38 provided on the gate electrode film 37, and a source and a drain provided separate from each other in the P-well 31. The selection transistor ST2 has the same configuration.

The word lines WL0-WL31 commonly connect the control gate electrodes of each of the memory cell transistors MT among the NAND strings in a block. That is, the control gate electrode of the memory cell transistor MT in the same row in a block is connected to the same word line WL. 16416 memory cell transistors MT connected to the same word line WL are handled as one page and data is written and read per page.

Further, the bit lines BL0-BL16415 commonly connect the drains of the selection transistors ST1 among the blocks. That is, NAND strings in the same row in a plurality of blocks are connected to the same bit line BL.

The present embodiment adopts a common sense amplifier scheme, in which an even-numbered bit line BLe and an odd-numbered bit line BLo adjacent to each other share one sense amplifier SA. This is a result of consideration of the difficulty in arranging a sense unit in each bit line pitch due to miniaturization of the memory cell array 10, and the inevitable increase in capacity coupling noise between adjacent bit lines. The even-numbered bit line BLe and the odd-numbered bit line BLo can decrease the effect of noise caused by capacity coupling between bit lines by using one of the bit lines as a shield line while the other is selected.

In the NAND flash memory of the present embodiment, a group of memory cell transistors MT selected by a word line and all the even-numbered bit lines BLe forms a first page (even-numbered page) and a group of memory cell transistors MT selected by the word line and all the even-numbered bit lines BLo forms a second page (odd-numbered page).

FIG. 5 is a circuit diagram showing a configuration of a sense unit (sense amplifier) SA included in the sense amplifier circuit 13. A control signal to the sense amplifier SA is supplied from the state machine 18.

When the common sense amplifier system is used, the memory system 1 comprises a bit line selection circuit (selection transistors Q1-Q4). More specifically, the bit line selection circuit has selection transistors Q1, Q2 in which gates are driven by selection signals BLSe, BLSo for selectively connecting the bit lines BLe, BLo to a node SABL, and bias transistors Q3, Q4 in which gates are driven by signals BLASe, BLASo to give a fixed bias BLCRL to the bit line BLe or BLo which is in a non-selection state.

The node SABL is connected to a sense node TDC via a clamp NMOS transistor Q5. A signal BLCLAMP is supplied to a gate of the clamp NMOS transistor Q5. The NMOS transistor Q5 has a function of clamping a bit line voltage and a function of pre-sense amplifying bit line data. A precharge voltage VPRE is supplied to the sense node TDC via a precharge NMOS transistor Q6 for precharging the bit lines. A signal BLPRE is supplied to a gate of the NMOS transistor Q6. A charge holding capacitor C is connected to the sense node TDC.

Further, data latches PDC, SDC are connected in parallel to the sense node TDC via the data transfer NMOS transistors Q7, Q19. Each of the data latches PDC, SDC is configured by means of clocked inverters.

The data latch PDC is a main data storage circuit used for data writing and reading. The data latch PDC is formed of clocked inverters CI1, CI2, and an NMOS transistor Q14. The NMOS transistor Q14 is mutually connected between an input of the clocked inverter CI1 and an input of the clocked inverter CI2. A signal EQ1 is supplied to the gate of the NMOS transistor Q14. Activeness/inactiveness of the clocked inverter CI1 is controlled by signals SEN1, SEN1$n$. Activeness/inactiveness of the clocked inverter CI2 is controlled by signals LAT1, LAT1$n$.

A data write-back circuit including a storage node DDC for temporarily storing write data is configured between a node N1 of the data latch PDC and the sense node TDC. More specifically, a data transfer NMOS transistor Q8 is provided between a gate of an NMOS transistor Q9, which becomes a storage node DDC, and the node N1. A signal DTG is supplied to a gate of the NMOS transistor Q8.

A precharge voltage VPRE is supplied to one end of a current path of the NMOS transistor Q9. A write-back NMOS transistor Q10 for determining write data of the next cycle according to held data in the storage node DDC is provided between the other end of the current path of the NMOS transistor Q9 and the sense node TDC. A signal REG is supplied to the gate of the NMOS transistor Q10. The above-described configuration makes it possible to perform the control of mandatorily discharging or charging the sense node TDC during verification reading according to data held in the storage node DDC.

The storage node BDC stores data indicative of whether a verification level slightly lower than a specific verification level has been reached when data is written. A data transfer NMOS transistor Q11 is provided between a gate of an NMOS transistor Q12 which becomes a storage node BDC and the node N1. A signal DTGB is supplied to a gate of the NMOS transistor Q11.

A precharge voltage VPRE_BDC is supplied to one end of the current path of the NMOS transistor Q12. A write-back NMOS transistor Q13 for determining write data of the next cycle according to held data in the storage node BDC is provided between the other end of the current path of the NMOS transistor Q12 and the sense node TDC. A signal BREG is supplied to the gate of the NMOS transistor Q13. The above-described configuration makes it possible to perform the control of mandatorily discharging or charging the sense node TDC during verification reading according to data held in the storage node BDC.

A node N2 of the data latch PDC is connected to a gate of an NMOS transistor Q16. One end of a current path of the NMOS transistor Q16 is grounded via an NMOS transistor Q15. A signal CHK1 is supplied to a gate of the NMOS transistor Q15. The other end of the current path of the NMOS transistor Q16 is connected to one end of a current path of NMOS transistors Q17, Q18 forming a transfer gate. A signal CHK2n is supplied to a gate of the NMOS transistor Q17. The gate of the NMOS transistor Q18 is connected to the sense node TDC. A signal COMi is supplied to the other end of the current path of the NMOS transistors Q17, Q18. The signal COMi is a signal common to all the sense amplifiers SA, and is a signal indicative of whether verification of all the sense amplifiers SA has been completed or not. That is, after the verification is completed, the node N2 of the PDC is set to a low level. In this state, when the signals CHK1, CHK2n are set to a high level, the signal COMi is set to a high level when verification has been completed.

The data latch SDC is formed of clocked inverters CI3, CI4, and NMOS transistors Q20, Q21. The NMOS transistor Q20 is connected between an input of the clocked inverter CI3 and an input of the clocked inverter CI4. A signal EQ2 is supplied to a gate of the NMOS transistor Q20. The node N3 of the data latch SDC is grounded via the NMOS transistor Q21. A signal PRST is supplied to a gate of the NMOS transistor Q21.

A node N3 of the data latch SDC is connected to an input/output data line IO via a column selection transistor Q22, and a node N4 of the data latch SDC is connected to an input/output data line IOn via a column selection transistor Q23. A column selection signal CSLi is supplied from the column decoder 12 to a gate of each of the column selection transistors Q22, Q23.

[2. Operation of Memory System 1]

The operation of the memory system 1 with the above-described configuration will be described below. In the memory cell transistor MT, electrons are trapped in the tunnel insulation film after writing and erasure are repeated, which causes the current (hereinafter referred to as a cell current) flowing through the memory cell transistor MT to be degraded and reduced. It is therefore possible to judge whether the memory cell transistor MT has been degraded or not by assessing the cell current. The cell current is a current which flows in the diffusion region via the channel while the memory cell transistor MT is turned on.

FIG. 6 is a graph showing current-voltage characteristics of a not-yet-degraded memory cell transistor (not-yet-degraded cell) and a degraded memory cell transistor (degraded cell). The lateral axis denotes the voltage (VCG) applied to the control gate electrode of the memory cell transistor MT, and the vertical axis denotes a natural logarithm ($\log_e$ I) of a cell current I of the memory cell transistor MT. Characteristics in a state where data is erased are shown in both of the not-yet-degraded cell and the degraded cell. As shown in FIG. 6, the degraded cell decreases in cell current I compared to the not-yet-degraded cell.

[2-1. Judge Operation of Degraded Block]

FIG. 7 is a flowchart showing a judge operation for judging degraded blocks. The degraded block judge operation of the present embodiment includes a cell current measurement operation in which a cell current of each memory cell transistor is measured. The cell current measurement operation is performed by applying a usual data read operation. Since existence of a cell to which data has been written in the NAND string causes a decrease in cell current, all the cell data in the block is erased (set to an erasure state) in order to perform a degraded block judge operation.

The host controller 2 issues a degradation judge command to the memory system 1. Upon receipt of the degradation judge command (step S10), the state machine 18 measures cell currents of all the memory cell transistors MT in a block (cell current measurement operation) (step S11). Then, the state machine 18 assesses each cell current to judge whether or not the memory cell transistor MT to be measured has been degraded or not (whether the cell has been degraded or not). More specifically, the memory cell transistor is judged as having been degraded when the cell current of a memory cell transistor to which rewriting is performed repeatedly is equal to or smaller than a predetermined value such as 0.1 μA, and the cell current of a memory cell transistor to which rewriting is not performed at all is equal to or more than 1 μA.

Next, the state machine 18 judges whether the ratio of the number of degraded cells to the number of all the memory cell transistors MT included in a block has exceeded a predetermined ratio (such as 80%) (step S12). The predetermined ratio is used as a reference for judging whether blocks have been degraded, and may be set as appropriate. When the predetermined ratio has been exceeded, the state machine 18 writes a flag indicating that the block has been degraded in a redundant part of the block (step S13). When the predetermined ratio is judged as not having been exceeded in step S12, the state machine 18 does not write a flag to the block. The state machine 18 repeats the operations of the steps S11-S13 until the cell current measurement of all the blocks is completed (step S14).

Next, the cell current measurement operation of the memory cell transistor MT will be described. The cell current is measured by the discharge characteristics of the memory cell transistor MT. In a usual read operation, in order to suppress the effect by the adjacent cells or the effect caused by the degraded cell, the bit line discharge time is taken sufficiently and a threshold voltage is determined in a place where the current flowing through the NAND string is small. In the cell current measurement operation of the present embodiment, however, in order to perform judge in a place where the current is large, the bit line discharge time can be set shorter as compared to the usual reading operation.

Figure 8:
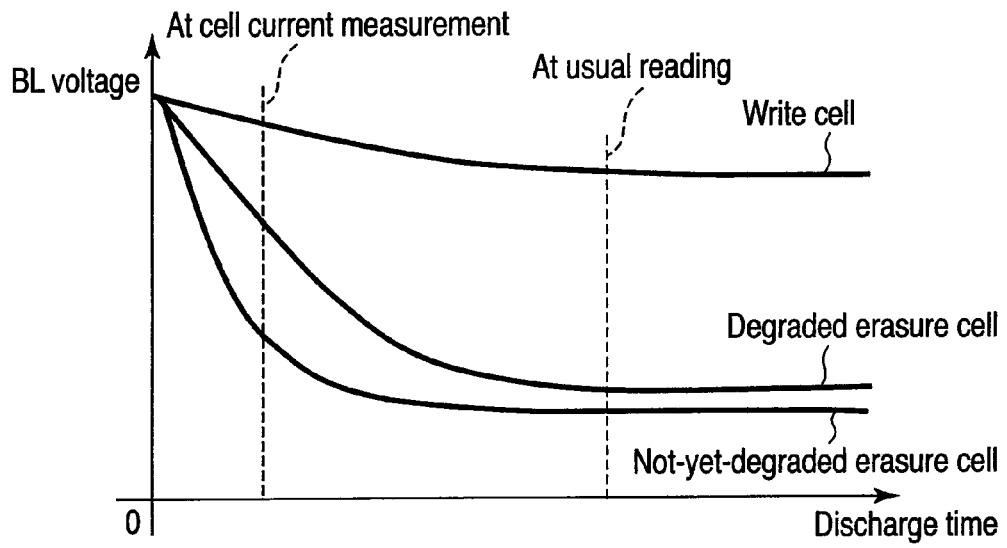
FIG. 8 shows discharge characteristics of bit lines at the time of cell current measurement.

FIG. 8 is a graph showing charge characteristics of bit lines during the cell current measurement. The lateral axis denotes the discharge time of the bit lines, and the vertical axis denotes the bit line voltage (BL voltage). Further, FIG. 8 shows discharge characteristics of a cell in a write state (write cell), a not-yet-degraded cell in an erasure state (not-yet-degraded erasure cell), and a degraded cell in an erasure state (degraded erasure cell).

The bit line voltage of the not-yet-degraded erasure cell suddenly drops and settles to a predetermined value after discharge of the bit line is started. On the other hand, the bit line voltage of the degraded erasure cell, the cell current of which is small, gradually decreases and settles to a predetermined value after discharge of the bit line is started. In the present embodiment, the timing at which the cell current is measured is determined as an erasure state ("0" data storage) in the not-yet-degraded erasure cell, and as a write state ("1" data storage) in the degraded erasure state.

As a result, when the cell current is measured at the timing shown in FIG. 8 with a read voltage, which is turned on in an erasure state, applied to the control gate electrode of the memory cell transistor MT, the not-yet-degraded erasure cell is judged as being in an erasure state ("0" data storage) since the bit line voltage has sufficiently decreased, but the degraded erasure cell is judged as being in a write state ("1" data storage) since the bit line voltage has not decreased very much. Thus, the cell current of the memory cell transistor MT can be measured.

Figure 9:
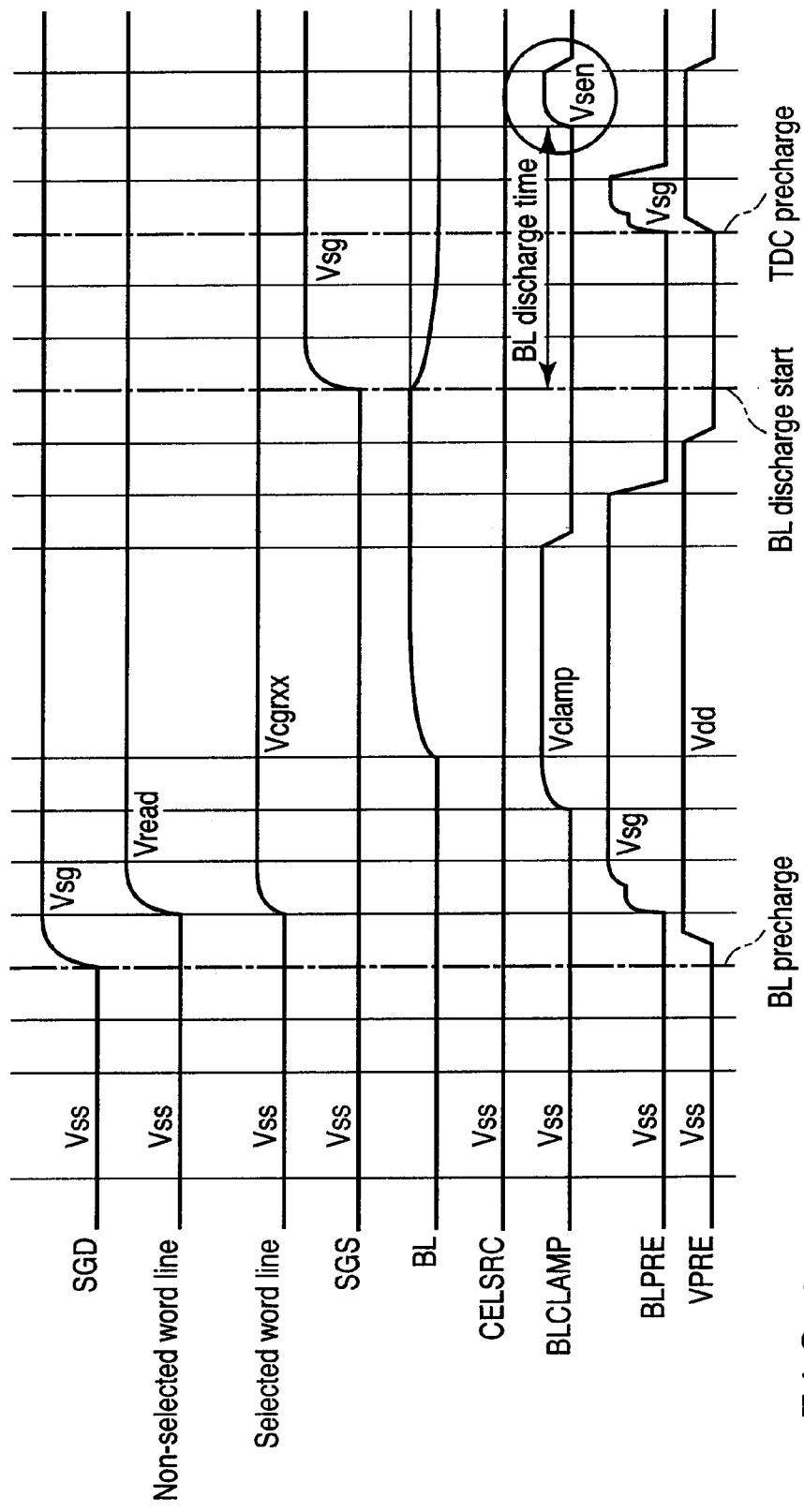
FIG. 9 is a timing chart showing a cell current measurement operation of the memory system 1.

FIG. 9 is a timing chart showing a cell current measurement operation of the memory system 1. First, the source line control circuit 19 sets the voltage CELSRC of the source line SL to a ground voltage Vss. In this state, the selection gate line SGS is set to the ground voltage Vss by the row decoder 11, and the selection transistor ST2 is set off.

Next, the bit line BL is precharged. That is, the selection gate line SGD is set to a voltage Vsg (Vdd+Vth) higher than a power voltage Vdd by a threshold voltage Vth of the transistor, and the selection transistor ST1 is set on. Next, the precharge voltage VPRE is set to the power voltage Vdd, and the signal BLPRE is set to the voltage Vsg. Thereby, the NMOS transistor Q6 is turned on and the sense node TDC is set to the voltage Vdd. Since the signal BLCLAMP is set to the voltage V clamp (such as Vdd+Vth), the clamp NMOS transistor Q5 is turned on, and the bit line is precharged to the voltage Vdd. Then, the signal BLCLAMP is set to the ground voltage Vss and the clamp NMOS transistor Q5 is turned off, and the bit line is brought into a floating state.

Further, the word line WL (selected word line) to which a memory cell transistor to be measured is connected is set by the row decoder 11 to a read voltage Vcgrxx, and the other word lines WL (non-selected word lines) are set to a read pass voltage Vread higher than the upper values of the threshold voltages of all the data. In the cell of binary data (1 bit) storage, for example, a read voltage Vcgrxx is set to the voltage at which the cell in an erasure state (cell retaining "0" data) is turned on, and the cell in a write state (cell retaining "1" data) is turned off.

Next, the bit line BL is discharged. That is, the selection gate line SGS is set to the voltage Vsg (Vdd+Vth) by the row decoder 11, and the selection transistor ST2 is turned on.

After the data latch PDC is set to an inactive state, the NMOS transistor Q7 is turned on, and the sense node TDC and the node N1 are set to the same voltage. After the voltage VPRE is set to the power voltage Vdd, the NMOS transistor Q6 is turned on and the sense node TDC is precharged to the power voltage Vdd. After that, the NMOS transistor Q6 is turned off.

Next, a sense voltage Vsen is applied to a signal BLCLAMP. The BL discharge time from when the selection transistor ST2 is turned on to when the sense voltage Vsen is applied to the signal BLCLAMP is set shorter as compared to the usual reading operation.

If the bit line voltage is discharged from "VPRE–Vth" to "Vsen–Vt", the clamp NMOS transistor Q5 is turned on, and the voltages of the nodes TDC and N1 are reduced to be approximately the same as the bit line voltage. In this case, the voltages of the nodes TDC and N1 are reduced from Vdd to the bit line voltage. Further, the bit line capacity is far larger than the capacity of the nodes TDC and N1, the charge of the nodes TDC and N1 is discharged instantaneously. When the bit line voltage is not discharged to "Vsen–Vth" since the clamp NMOS transistor Q5 is not turned on, Vdd is held in the nodes TDC and N1. Next, the data latch PDC is set to an active state, and the voltage of the sense node TDC is sensed by the data latch PDC. Thus, the cell current of the memory cell transistor MT can be measured.

[2-2. Write Operation]

Degradation of a cell causes an increase in electrons trapped in a tunnel insulation film of the cell, which results in an increase in the threshold voltage of the cell. Thereby, the degraded cell is easier to be written than a not-yet-degraded cell. When the NAND flash memory is multivalued, the threshold voltage will be set higher than the desired threshold voltage when the data is written. As a result, a defect, called an over-program condition, in which data different from desired data is written, occurs.

Figure 10:
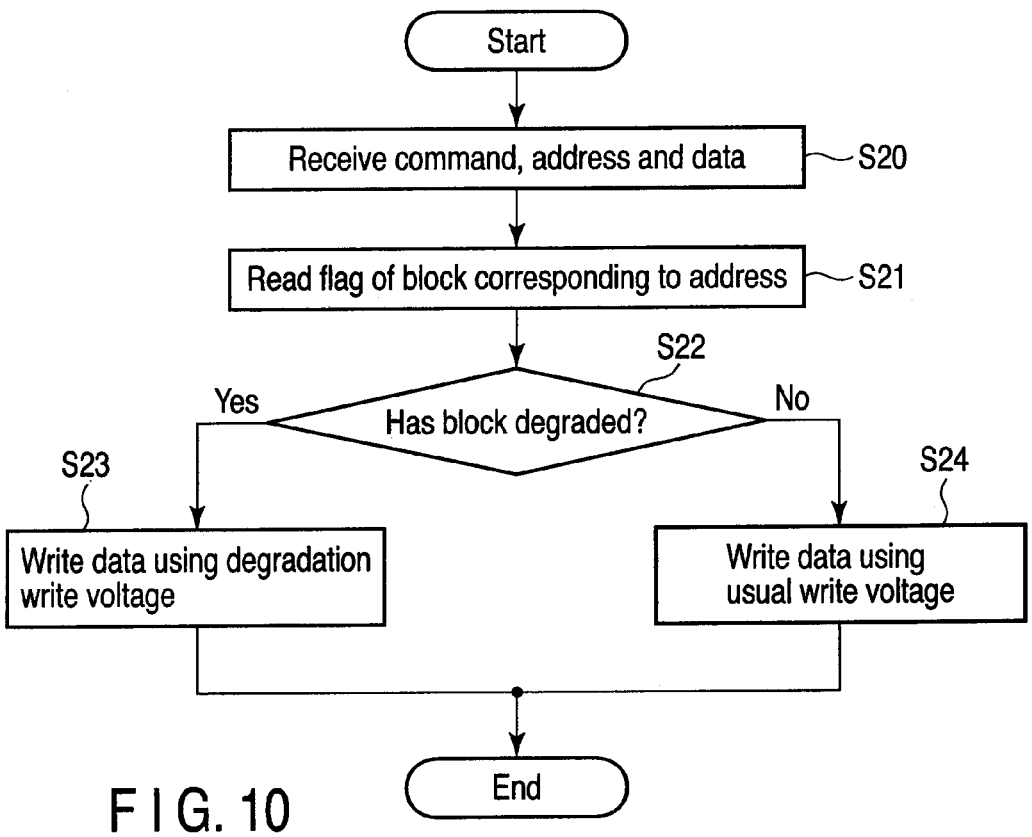
FIG. 10 is a flowchart showing a write operation of the memory system 1.

In the present embodiment, however, since degraded blocks can be judged in advance, the over-program condition of the degraded blocks can be suppressed by decreasing the write voltage when data is written. That is, when a block is judged as having been degraded as a result of judge as to whether the block has been degraded or not, the write voltage of the degraded block is changed and a write operation is performed on the degraded block. FIG. 10 is a flowchart showing a write operation of the memory system 1.

First, the host controller 2 issues a write command to the memory system 1 and then transmits an address and data. The memory system 1 receives the write command, the address, and the data (step S20).

Next, the state machine 18 reads a flag indicative of whether a block corresponding to an address has been degraded or not (steps S21). Then, the state machine 18 judges whether the block has been degraded or not using the flag (step S22).

If the block has not been degraded, the row decoder 11 writes data to the block using the usual write voltage (step S24).

The data writing is performed by a "0" write operation which increases the threshold voltage by injecting electrons to the floating gate electrode of the memory cell transistor. The write data "1" is handled as a write prohibition operation which does not perform such an electron injection.

When data is written, a write voltage Vpgm of approximately 20V is applied to a selected word line in a state where the channel of the selected cell is set to Vdd–Vth (where Vth is the threshold voltage of the selection transistor) or Vss according to write data "1" or "0" via the bit line. Thereby, in the "0" write cell, the electrons are injected to the floating gate electrode from the channel and the threshold voltage increases. Further, when data is written, a write pass voltage of approximately 10 V is applied to the non-selected word line. Thereby, the pressure of the channel is raised by the capacity coupling and the ion implantation is prevented from occurring.

When the block is judged as having been degraded in step S22, the row decoder 11 uses a degradation write voltage lower than the usual write voltage to write data to the block (step S23). The range of reduction in the write voltage is determined based on the characteristics of the memory cell transistor MT, and is configured, for example, such that the write voltage is reduced by the degree to which the threshold voltage of the degraded memory cell transistor MT is increased. This write operation suppresses the over-program problem from occurring in degraded blocks.

[3. Storage System of Flag]

Figure 11:
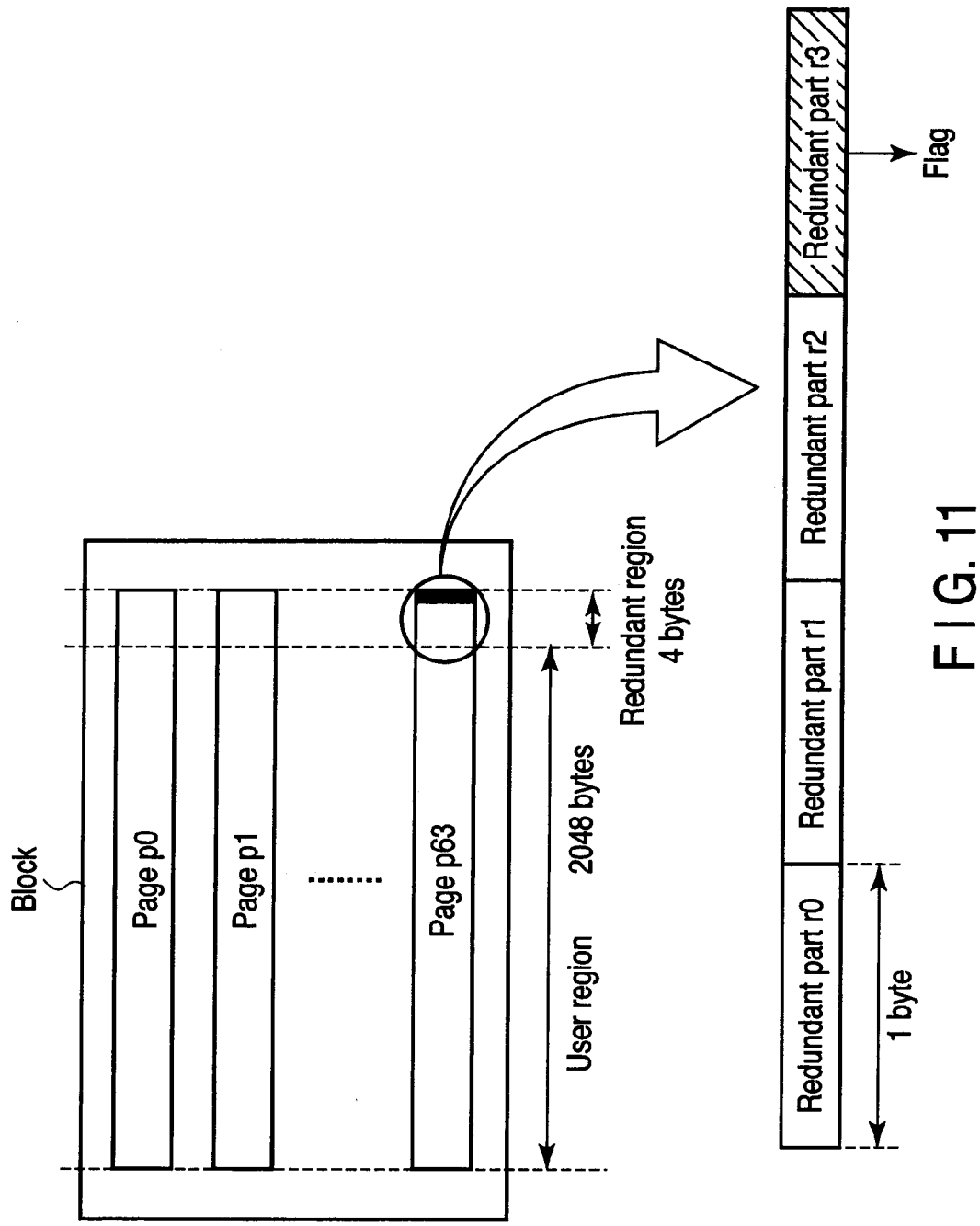
FIG. 11 shows a configuration of a redundant region of a block.

Next, the storage system of a flag indicating that the block has been degraded will be explained. The NAND flash memory (memory cell array 10) has a redundant region in each block, and a flag is stored in a part of the redundant region. FIG. 11 shows a configuration of the redundant region of a block.

In the present embodiment, one block comprises 64 pages p0-p63. Each page has 2052 bytes, and 2048 bytes of them are user regions storing user data, and the other 4 bytes are redundant regions. A redundant part (such as a redundant part r3) of one byte of a redundant region (redundant part r03) of four bytes of an appropriate page is used to store a flag.

In the present embodiment, in order to make the flag data indicating that the block has been degraded reliable, "8'hFF" is written to the redundant part r3 of a degraded block, and "8'h00" is written to a not-yet-degraded block. "8'h" denotes a 8-bit width and a hexadecimal notation. It is judged whether the block has been degraded according to majority rule between "1" data and "0" data in 8-bit flag data. The address to which a flag is to be written may be any redundant part not used for other reasons, as well as the redundant part r3. The bit number of the flag data may be any number as long as the reliability for judging degradation of blocks can be secured.

According to the present embodiment, as described above, by measuring the cell current of the memory cell transistor, it can be judged whether the memory cell transistor has been degraded or not. More specifically, by using discharge characteristics of a cell in an erasure state, degradation of the memory cell transistor is judged according to the intensity of the cell current at a predetermined discharge time (level of the bit line voltage). This makes it possible to recognize degraded memory cell transistors. Further, by judging degradation of all the memory cell transistors in a block, degradation can be judged in each block unit.

Further, the degraded block is set to have a lower write voltage as compared to the usual write voltage. Thereby, the over-program problem is prevented from occurring, and the time required in a write operation can be decreased, and data reliability can be improved.

Further, in a degraded block, a flag indicating that the block has been degraded is stored in a redundant region of the block. Thereby, it is possible to easily judge whether the block has been degraded or not in the write operation, for example, as will be described below.

Further, since the flag data indicating that the block has been degraded is formed of a plurality of bits, the plurality of bits can be comprehensively judged to read the state of the flag.

Second Embodiment

The blocks are collectively erased prior to writing. The erasure operation will be performed as follows. First, all the word lines in the blocks are set to the ground voltage Vss by the row decoder 11. Second, the P-well control circuit 20 applies an erasure voltage Vera of approximately 20 V to the P-well 31 in which the blocks are formed. Thereby, all the memory cell transistors MT in the blocks are brought into an erasure state in which the threshold voltage is low, after the electrons in the floating gate electrode are emitted to the P-well 31. The data erasure is performed by repetition of application of an erasure voltage and erasure verification confirming the state of erasure.

Figure 12:
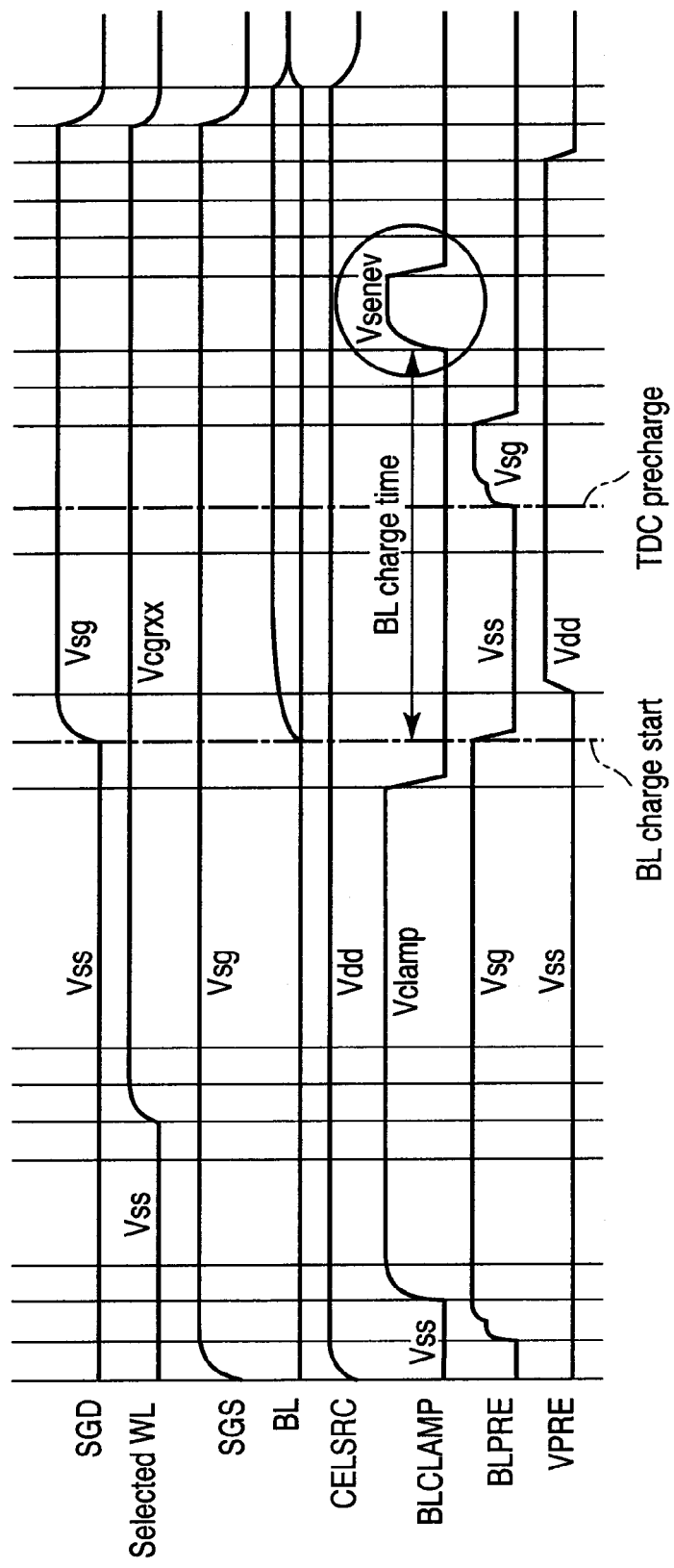
FIG. 12 is a timing chart showing a cell current measurement operation of a memory system 1 according to a second embodiment.

In the second embodiment, an erasure verification operation for judging whether the data has been correctly erased is applied to measure the cell current of the memory cell transistor MT. FIG. 12 is a timing chart showing a cell current measurement operation of the memory system 1 according to the second embodiment.

The cell current is measured by the discharge characteristics of the memory cell transistor MT, as in the case of the first embodiment. In the usual erasure verification operation, in order to suppress the effect by the adjacent cells or the effect caused by the degraded cell, a sufficient bit line charge time is taken, and the threshold value is determined in a place where the current flowing through the NAND string is low. However, in the cell current measurement of the present embodiment, in order to perform judge in a place where the current is large, the bit line charge time is set short.

The source line control circuit 19 sets the voltage CELSRC of the source line SL to the power voltage Vdd. The selection gate line SGS is set to the voltage Vsg (Vdd+Vth) by the row decoder 11, and the selection transistor ST2 is set on. Further, the selection gate line SGD is set to the earth voltage Vss by the row decoder 11, and the selection transistor ST1 is set off.

Next, the bit line BL is discharged. That is, the voltage VPRE is set to the ground voltage Vss, and the signal BLPRE is set to the voltage Vsg. Thereby, the NMOS transistor Q6 is turned on, and the sense node TDC is set to the voltage Vss. Then, by setting the signal BLCLAMP to the voltage Vclamp (such as Vdd+Vth), the clamp NMOS transistor Q5 is turned on, and the bit line is discharged to the voltage Vss.

After that, the word line WL (selected word line) to which the memory cell transistor to be measured is set to a read voltage Vcgrxx by the row decoder 11, and the other word lines WL (non-selected word lines) are set to a read pass voltage Vread higher than the upper limit of the threshold voltages of all the data. After that, the signal BLCLAMP and the signal BLPRE are set to the earth voltage Vss, and the clamp NMOS transistor Q5 and the NMOS transistor Q6 are set off.

Next, the bit line BL is charged by discharge characteristics of the memory cell transistor to be measured. That is, the selection gate line SGD is set to the voltage Vsg (Vdd+Vth) by the row decoder 11, and the selection transistor ST1 is turned on. Next, after the data latch PDC is set to an inactive state, the NMOS transistor Q7 is turned on, and the sense node TDC and the node N1 are set to the same voltage. After the voltage VPRE is set to the power voltage Vdd, the NMOS transistor Q6 is turned on and the sense node TDC is precharged to the power voltage Vdd. After that, the NMOS transistor Q6 is turned off.

Next, the sense voltage Vsenev is applied to the signal BLCLAMP. The BL charge time from when the selection transistor ST1 is turned on to when the sense voltage Vsenev is applied to the signal BLCLAMP is set shorter as compared to the usual erasure verification operation.

When the bit line is charged to a high level, since the clamp NMOS transistor Q5 is not turned on, the nodes TDC and N1 maintain Vdd. When the bit line maintains a low level, on the other hand, since the clamp NMOS transistor Q5 is turned on, the voltages of the nodes TDC and N1 decrease to such an extent that is approximately similar to the bit line voltage. In this case, the voltages of the nodes TDC and N1 decrease from Vdd to the bit line voltage. Further, since the bit line capacity is far larger than the capacity of the nodes TDC and N1, the nodes TDC and N1 are instantaneously discharged. Next, the data latch PDC is set to an active state, and the voltage of the sense node TDC is sensed by the data latch PDC.

In the usual erasure verification operation, in order to suppress the effect by the adjacent cells and the degraded cell to easily determine data, a sufficient charge time of the bit lines is taken. In the cell current measurement operation, on the other hand, in order to assess the degree of degradation, judge is performed in a place where the difference in bit line voltage is large between a not-yet-degraded cell and a degraded cell. By thus sensing the bit line voltage after a predetermined charge time shorter than the charge time during the erasure verification has passed, it is possible to judge whether the memory cell transistor has been degraded or not.

Third Embodiment

Figure 13:
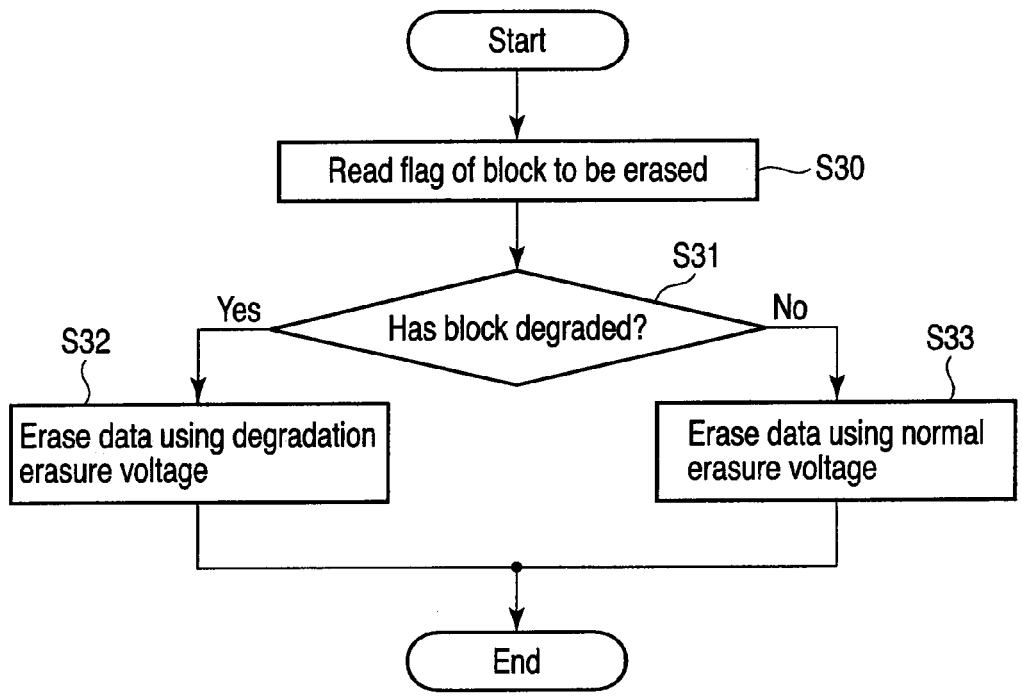
FIG. 13 is a flowchart showing an erasure operation of a memory system 1 according to a third embodiment.

A degraded memory cell transistor is more difficult to erase than a not-yet-degraded memory cell, since the threshold voltage of the memory cell transistor becomes high due to an increase in electrons trapped in the tunnel insulation film. In the third embodiment, whether the block has been degraded or not is judged prior to an erasure operation, and an erasure operation is performed on the degraded block with a higher erasure voltage. FIG. 13 is a flowchart showing an erasure operation of a memory system 1 according to a third embodiment.

A state machine 18 reads a flag indicative of whether a block to be erased has been degraded or not from the block (step S30). Then, the state machine 18 uses the flag to judge whether the block has been degraded or not (step S31). If the block has not been degraded, a P-well control circuit 20 uses a normal erasure voltage to erase data in the block to be erased (step S33).

When the block is judged as having been degraded in step S31, the p-well control circuit 20 uses a degradation erasure voltage higher than a normal erasure voltage and erases data in the block to be erased (step S32). The range of the increase of the erasure voltage is determined based on characteristics of the memory cell transistor MT. For example, the erasure voltage is increased by the degree by which the threshold voltage of the degraded cell transistor MT is increased.

In the past, when data in all the cells cannot be erased by one erasure operation, more erasure operations have been repeated until the data in all the cells is erased. The repeated erasure operations have made the erasure time long. In the present embodiment, on the other hand, an erasure operation is performed in a degraded block with an increased erasure voltage, and so the data in all the cells in the block can be erased by one erasure operation with higher probability. Thereby, an increase in erasure time can be suppressed.

Fourth Embodiment

When a memory cell transistor has been degraded, electrons trapped in a tunnel insulation film increase. Left neglected, the trapped electrons go through the tunnel insulation film, and the threshold voltage of the memory cell transistor decreases. That is, when the memory cell transistor has been degraded, data retention characteristics degrade. In the fourth embodiment, it is therefore judged whether the block has been degraded or not before the reading operation is performed, and a read operation is performed in the degraded block with a lower read voltage.

Figure 14:
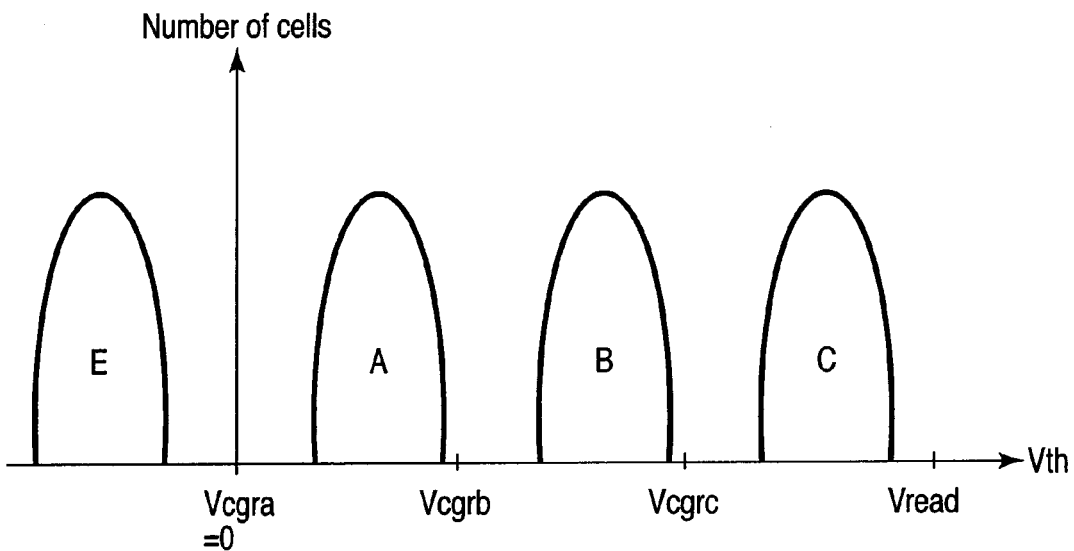
FIG. 14 shows a threshold voltage distribution of a not-degraded memory transistor MT.

FIG. 14 is a graph showing threshold voltage distribution of the memory cell transistor MT retaining multilevel (4-level) data before degradation. The lateral axis denotes the threshold voltage Vth of the memory cell transistor MT, and the vertical axis denotes the number of cells.

In this example, one distribution is allocated on the negative side of the threshold voltage, and three distributions are allocated on the positive side. The distributions will be referred to as "E", "A", "B", and "C" in the order of lowest to highest in threshold voltage. The read voltage for determining "E" and "A" will be referred to as Vcgra, the read voltage for determining "A" and "B" will be referred to as Vcgrb, and the read voltage for determining "B" and "C" will be referred to as Vcgrc. As shown in FIG. 14, in a not-yet-degraded memory cell transistor MT, a margin of data retention characteristics is secured by increasing the distance between each of the threshold distributions and the read voltage. Thus, a read operation is performed in a not-yet-degraded block by using Vcgra, Vcgrb, and Vcgrc as read voltages.

Figure 15:
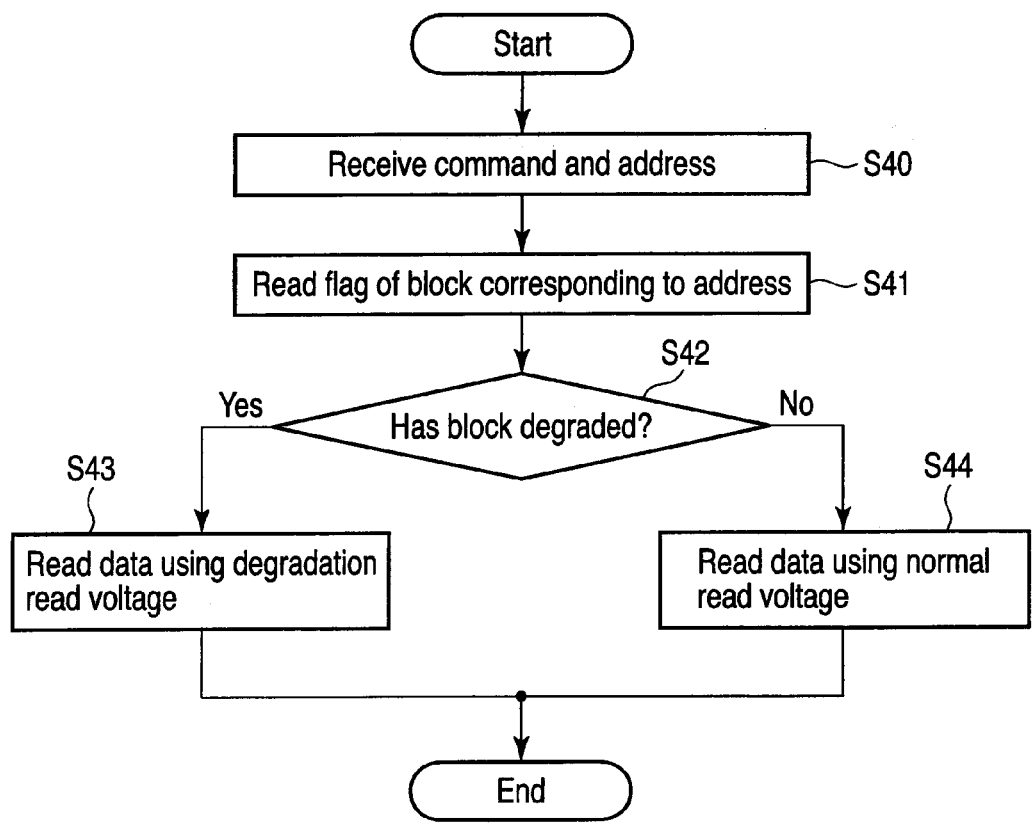
FIG. 15 is a flowchart showing a reading operation of a memory system 1 according to a fourth embodiment.

FIG. 15 is a flowchart showing a read operation of a memory system 1 according to the fourth embodiment of the present invention. First, a memory controller 2 issues a read command to the memory system 1 and transmits an address. The memory system 1 receives the read command and the address (step S40).

Next, a state machine 18 reads a flag indicative of whether a block corresponding to an address has been degraded or not from the block (step S41). Then, the state machine 18 uses the flag to judge whether the block has been degraded or not (step S42). If the block has not been degraded, the row decoder 11 uses read voltages Vcgra, Vcgrb, and Vcgrc to read data in the block (step S44).

When the block is judged as having been degraded in step S42, the row decoder 11 uses a degradation read voltage lower than the read voltages Vcgra, Vcgrb, and Vcgrc to read data in the block (step S43). The range of reduction of the read voltage is judged based on characteristics of the memory cell transistor MT, and is set, for example, by calculating the degree of drop in the threshold voltage of the degraded cell transistor MT with time.

As described above, according to the present embodiment, since the read operation is performed in the degraded block with a lower read voltage, improved reliability of data read from the memory cell transistor MT can be obtained.

Fifth Embodiment

In the fifth embodiment, a cell current of a memory cell transistor MT is measured to judge whether the block including the memory cell transistor MT has been degraded or not, and when the block has been degraded, the block is prohibited from being used (set as a bad block). FIG. 16 is a flowchart showing a block use prohibition setting operation of a memory system 1 according to the fifth embodiment of the present invention.

A host controller 2 issues a degradation judge command to the memory system 1. Upon receipt of the degradation judge command (step S50), a state machine 18 measures cell currents of all the memory cell transistors MT in one block (step S51). Then, the state machine 18 assesses each cell current to judge whether the memory cell transistor MT to be measured has been degraded or not.

Next, the state machine 18 judges whether the ratio of the number of the degraded cells to the number of all the memory cell transistors MT in a block has exceeded a predetermined ratio (such as 80%) (step S52). The predetermined ratio is used as a reference for judging whether the block has been degraded or not, and can be arbitrarily set. When the predetermined ratio has been exceeded, the state machine 18 prohibits use of the block (step S53). Specifically, the state machine 18 writes a Bad Block mark to the block. Any mark that can be recognized by the state machine 18 can be used as the Bad Block mark. The Bad Block is configured to write "0" data to all the cells in a block, for example. After that, the state machine 18 does not use the block set as the Bad Block.

When the predetermined ratio is judged as not having been exceeded in step S52, the state machine 18 does not write a Bad Block mark to the block. The state machine 18 repeats the operations of the steps S51-53 until measurement of the cell current of all the blocks is completed (step S54).

As described above, according to the present embodiment, whether the block has been degraded or not is judged, and the degraded block is prohibited from being used (set as a Bad Block). Since memory cell transistors MT with low data retention characteristics, low write characteristics, and low erasure characteristics, for example, are not used, improved reliability of the memory system 1 can be obtained as a result.

Sixth Embodiment

The sixth embodiment uses the number of times of erasure operations (the number of times of erasure loop) performed to erase all the data in a block as a method to judge whether the memory cell transistor MT has been degraded or not. The data in a degraded memory cell transistor MT is difficult to erase, as described above. When all the data in a block needs to be erased but could not be erased by one erasure operation, an erasure operation is repeated until all the data is erased. That is, the degree of degradation of a cell can be known based on the number of times the erasure operation has been repeated.

FIG. 17 is a flowchart showing a judge operation for judging whether the block has been degraded or not. The host controller 2 issues a degradation judge command to the memory system 1. Upon receipt of the degradation judge command (step S60), the state machine 18 reads the number of times of erasure loop in an arbitrary block (step S61). The number of times of erasure loop is measured by the state machine 18 during an erasure operation in each block. The number of times of erasure loop in each block may be stored in the state machine 18, or may be stored in an arbitrary region in the memory cell array 10.

Next, the state machine 18 judges whether the number of times of erasure loop exceeds a predetermined value (such as 2) (step S62). The predetermined value is used as a reference for judging whether the block has been degraded or not, and is determined based on characteristics of the memory cell transistor MT. When the predetermined value has been exceeded, the state machine 18 writes a flag indicating that the block has been degraded in a redundant part in the block (step S63). When it is judged in step S62 that the predetermined value has not been exceeded, the state machine 18 does not write a flag to the block. The state machine repeats the operations of the steps S61-S63 until the degradation judge of all the blocks is completed (step S64).

According to the present embodiment, as described above, whether or not the block has been degraded can be judged by using the number of times of erasure operations (number of times of erasure loop) performed to delete all the data in a block. Further, a flag indicating whether or not the block has been degraded or not can be used to perform the write operation, the erasure operation, and the read operation shown in the first, third, and fourth embodiments, respectively. Moreover, the fifth embodiment can be applied to the present embodiment to prohibit use of degraded blocks.

Seventh Embodiment

The seventh embodiment uses the number of times of write operations (number of times of program loop) performed to write (program) data to the memory cell transistor MT as a method to judge whether the block has been degraded or not. It is easier to write to a memory cell transistor MT which has been degraded, as described above. When it is judged that data is written to all the cells (one page) connected to a word line WL after some (such as 10) writing operations are performed to a cell before data is written, the write operation ends. That is, the degree of cell degradation can be known by how much the number of times of program loop decreases.

Figure 18:
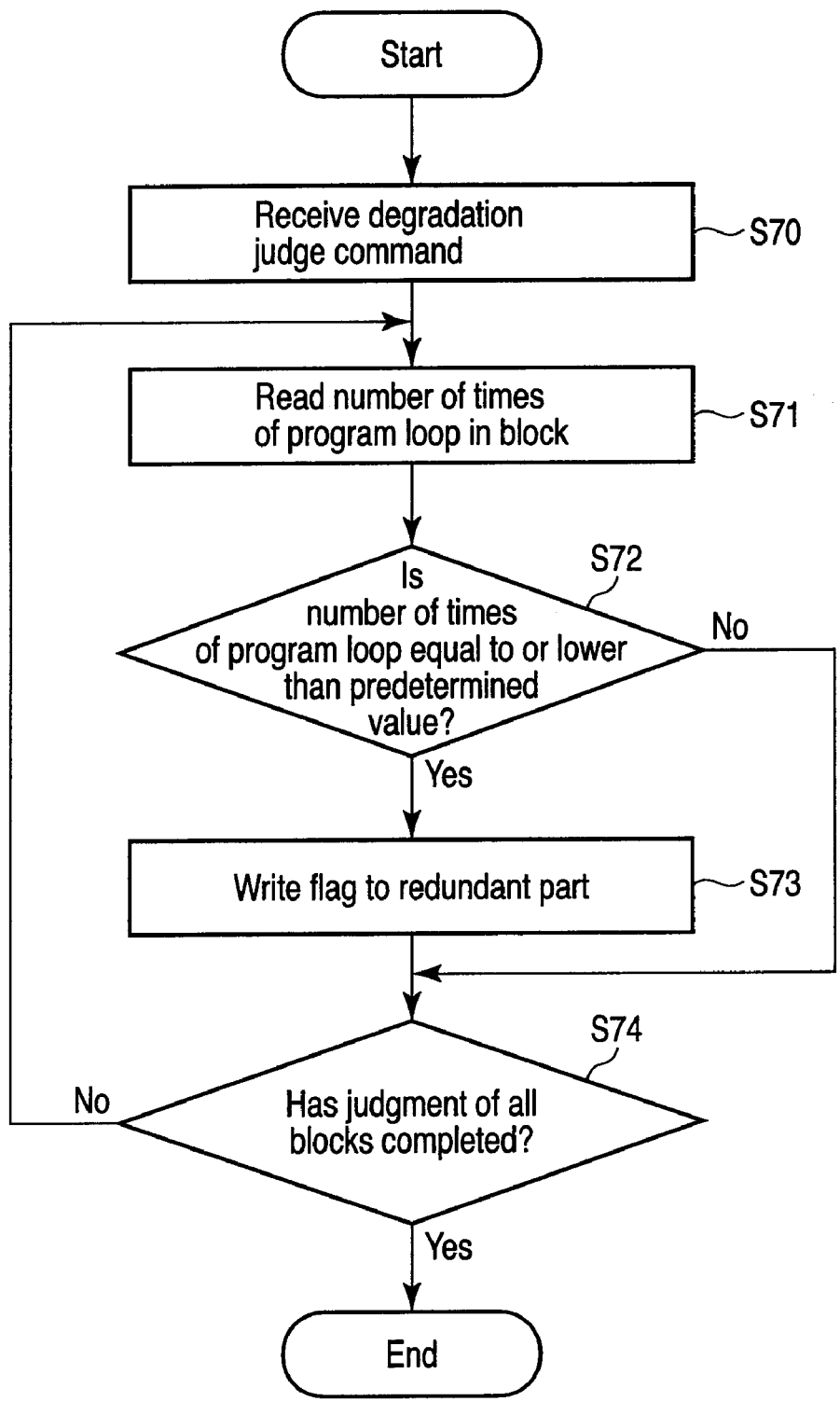
FIG. 18 is a flowchart showing a degraded block judge operation of a memory system 1 according to a seventh embodiment.

FIG. 18 is a flowchart showing a judge operation for judging degraded blocks. The host controller 2 issues a degradation judge command to the memory system 1. Upon receipt of the degradation judge command (step S70), the state machine 18 reads the number of times of program loop in an arbitrary block (step S71). The number of times of program loop is measured by the state machine 18 during the write operation to a page included in each block. The number of times of program loop in each page may be stored in the state machine 18 itself, or may be stored in an arbitrary region in the memory cell array 10.

Next, the state machine 18 judges whether the number of times of program loop is equal to or lower than a predetermined value (such as 10) (step S72). The predetermined value is used a reference for judging degraded blocks, and is determined based on characteristics of the memory cell transistor MT. If the number of times of program loop is equal to or lower than the predetermined value, the state machine 18 writes a flag indicating that the block has been degraded in a redundant part in the block (step S73). When the number of times of program loop is judged as being equal to or lower than the predetermined value in step S72, on the other hand, the state machine 18 does not write a flag to the block. Next, the state machine 18 repeats the operations of the steps S71-73 until the degradation judge of all the blocks is completed (step S74).

In the present embodiment, as described above, by using the number of times of program loop performed to write data in the memory cell transistor MT, whether the block including the memory cell transistor MT has been degraded or not can be judged. By using a flag indicating whether the block has been degraded or not, the write operation, the erasure operation, and the read operation shown in the first, third and fourth embodiments, respectively, can be performed. By applying the fifth embodiment to the present embodiment, degraded blocks may be prohibited from being used.

Eighth Embodiment

The eight embodiment shows a configuration example in which a host controller 2 controls setting change involved in degradation of a memory cell transistor. FIG. 19 is a flowchart showing a judge operation for judging degraded blocks. When a cell to which data is written exists in a NAND string, the cell current is lowered thereby. When a degradation block judge operation is performed, data in a block is erased in advance.

First, the host controller 2 issues a degradation judge command to a memory system 1. Upon receipt of the degradation judge command (step S80), the state machine 18 measures cell currents of all the memory cell transistors MT in one block (step S81). The state machine 18 assesses each cell current to judge whether the memory cell transistor MT to be measured has been degraded (is a degraded cell) or not.

Next, the state machine 18 judges whether the ratio of the number of degraded cells to the number of all the memory cell transistors MT in a block has exceeded a predetermined ratio (such as 80%) (step S82). The predetermined ratio is used as a reference for judging degraded blocks, and can be arbitrarily set. When the predetermined ratio has been exceeded, the state machine 18 generates status information indicating that the block has been degraded, and outputs the status information to the host controller 2 (step S83). When the predetermined ratio is judged as not having been exceeded in step S82, on the other hand, the state machine 18 does not generate status information to the block. Next, the state machine 18 repeats operations of the steps S81-S83 until measurement of the cell current of all the blocks is completed (step S84).

The host controller 2 uses status information to recognize degraded blocks. When the write operation, the erasure operation, and the read operation shown in the first, third and fourth embodiments, respectively, are performed, the host controller 2 instructs the memory system 1 to change setting of a write voltage, an erasure voltage, and a read voltage. The memory system 1 uses the write voltage, the erasure voltage, and the read voltage instructed by the host controller 2 to perform the write operation, the erasure operation, and the read operation.

In the present embodiment, since setting is changed by the host controller 2, setting change can be performed depending on the use of each product. As a method of degradation judge, the sixth and seventh embodiments may be used.

Ninth Embodiment

Figure 20:
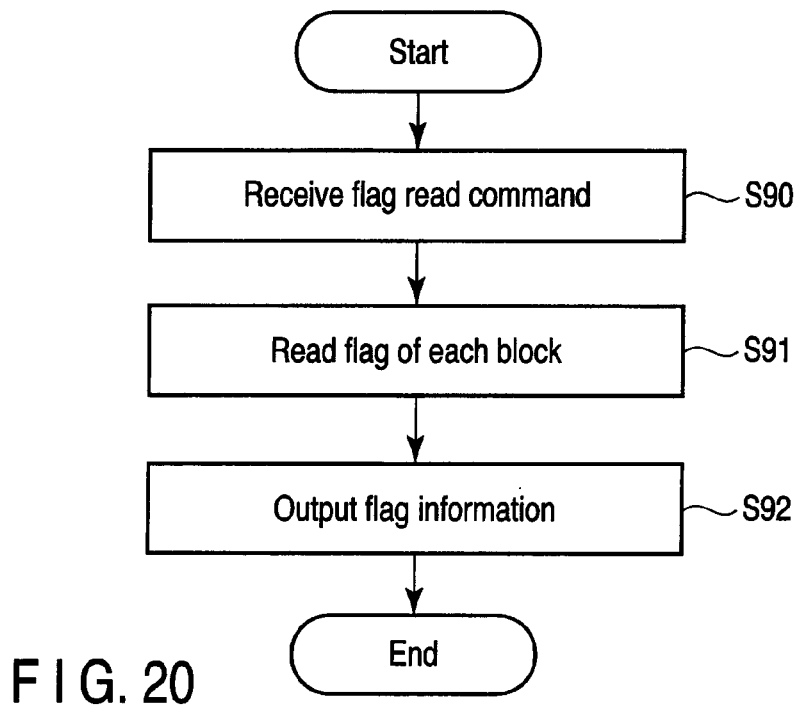
FIG. 20 is a flowchart showing a degraded block information output operation of a memory system 1 according to a ninth embodiment.

In the ninth embodiment, a memory system 1 outputs information indicating whether the block has been degraded or not to the user or a host controller 2. FIG. 20 is a flowchart showing degradation block information output operations of the memory system 1. The operations until a flag indicating whether the block has been degraded or not is stored in a redundant region of a block are the same as those described in the first, sixth, and seventh embodiments.

First, the host controller 2 issues a flag read command to the memory system 1. Upon receipt of the flag read command (step S90), a state machine 18 reads a flag stored in each block and indicating whether the block has been degraded or not (step S91).

Next, the state machine 18 generates flag information formed of a plurality of flags read from all the blocks, and outputs the flag information to the host controller 2 (step S92). The host controller 2 uses the flag information to recognize degraded blocks. After that, the host controller 2 can instruct the memory system 1 to perform a write operation, for example, using blocks which have not been degraded.

Figure 21:
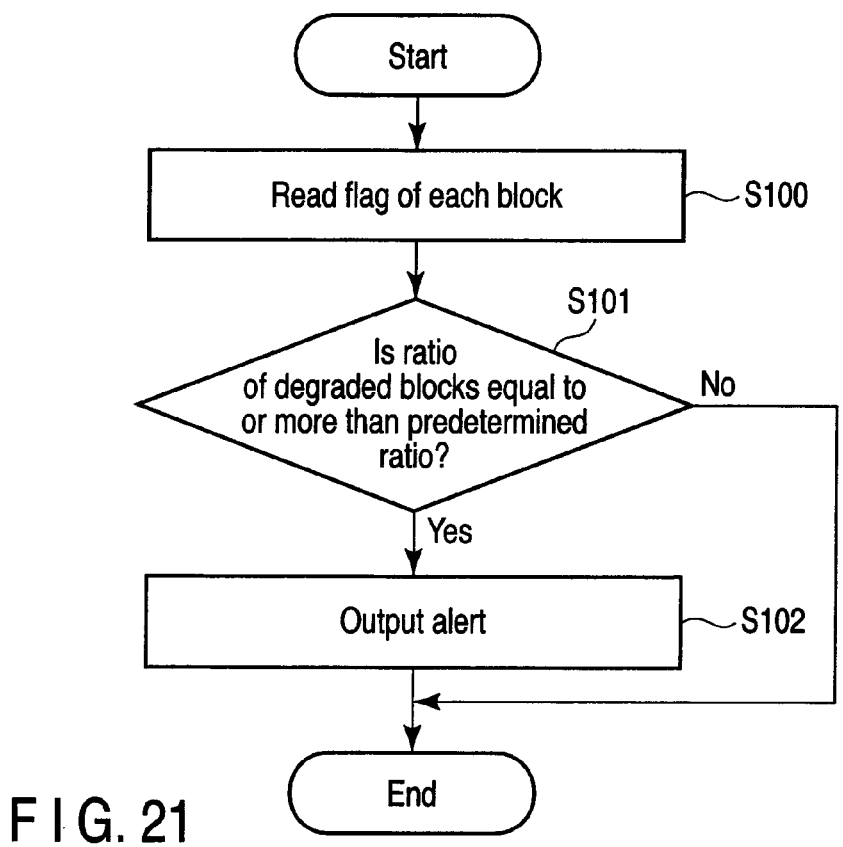
FIG. 21 is a flowchart showing an alert output operation of a memory system 1.

When the ratio of the number of degraded blocks to the number of all the blocks included in the memory cell array 10 is equal to or more than a predetermined ratio (equal to or more than 80% of all the blocks, for example), an alert may be issued to urge the user or the host controller 2 to change the memory. FIG. 21 is a flowchart showing an alert output operation urging change of the memory.

The state machine 18 reads a flag indicating whether the block stored in each block has been degraded or not (step S100). Next, the state machine 18 uses the flags to judge whether the ratio of the number of degraded blocks to the number of all the blocks included in the memory cell array 10 is equal to or more than a predetermined ratio (e.g., equal to or more than 80% of all the blocks) (step S101). When the ratio of degraded blocks is equal to or more than the predetermined ratio, the state machine 18 outputs an alert urging the user or the host controller 2 to change the memory (step S102).

The user can recognize that the duration of the memory is short based on the alert, and can take measures such as copying data in another memory before the data stored in the memory becomes impossible to read. The alert output operation may be performed for each degradation judge operation of a block, or only when a command is received from the host controller 2.

The above-described status information or the flag information may be used in a brief reliability test. A usual reliability test of a non-volatile semiconductor memory must be performed based on very broad assessments such as a disturb assessment and a data retention assessment after writing and erasure stress application. In degradation judge of the present embodiment, on the other hand, judge can be performed simply by reading a flag, and such a degradation judge method may be incorporated in a shipping test, for example.

The present invention is not limited to the above-described embodiments, and can be embodied by modifying constituent elements within the range of not departing from the spirit thereof. The present invention is not limited to a NAND flash memory, and can be generally applied to non-volatile semiconductor memories in which electrons are implemented to a charge storage layer using a tunnel insulation film, such as NOR and AND flash memories. Further, the state machine 18 described as a controller in the above-described embodiments may be configured as a hardware logic or a microcomputer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A memory system comprising:
   a memory device including a plurality of blocks each including a plurality of memory cells, and a state machine; and
   a host controller,
   wherein the host controller is configured to send a command for judging whether a memory cell of the plurality of memory cells in a block of the plurality of blocks has been degraded to the memory device,
   the state machine is configured to measure a cell current flowing through one of the plurality of memory cells when the memory device receives the command, and
   the state machine is configured to send status information to the host controller when a ratio of a number of degraded memory cells to a number of all memory cells in a first block which is one of the plurality of blocks has exceeded a first ratio, based on the measured result by the state machine.

2. The system according to claim 1, wherein the state machine does not send status information to the host controller when the ratio of the number of degraded memory cells to the number of all memory cells in a second block which is another of the plurality of blocks has not exceeded the first ratio, based on the measured result by the state machine.

3. The system according to claim 1, wherein the status information indicates that the first block has been degraded.

4. The system according to claim 3, wherein the host controller is configured to instruct the memory device that a first write voltage to be applied to the first block is lower than a second write voltage to be applied to a block which has not been degraded when the host controller receives the status information.

5. The system according to claim 3, wherein the host controller is configured to instruct the memory device that a first erasure voltage to be applied to the first block is greater than a second erasure voltage to be applied to a block which has not been degraded when the host controller receives the status information.

6. The system according to claim 3, wherein the host controller is configured to instruct the memory device that a first read voltage to be applied to the first block is lower than a second read voltage to be applied to a block which has not been degraded when the host controller receives the status information.

7. The system according to claim 1, wherein
   the memory device includes:
   a bit line electrically connected to a first end of a current path of the memory cell;
   a source line electrically connected to a second end of the current path of the memory cell; and
   a sense amplifier circuit electrically connected to the bit line and configured to read data from the memory cell,
   the sense amplifier circuit charges the bit line in degradation judgment of the memory cell,
   the state machine judges whether the bit line has been discharged by the memory cell in an ON state after elapse of a judgment time, and
   the judgment time is set shorter than a time to judge data stored in a memory cell in reading data.

8. The system according to claim 2, wherein the status information indicates that the first block has been degraded.

9. The system according to claim 8, wherein the host controller is configured to instruct the memory device that a first write voltage to be applied to the first block is lower than a second write voltage to be applied to the second block when the host controller receives the status information.

10. The system according to claim 8, wherein the host controller is configured to instruct the memory device that a first erasure voltage to be applied to the first block is greater than a second erasure voltage to be applied to the second block when the host controller receives the status information.

11. The system according to claim 8, wherein the host controller is configured to instruct the memory device that a first read voltage to be applied to the first block is lower than a second read voltage to be applied to the second block when the host controller receives the status information.

12. The system according to claim 1, wherein the state machine is configured to measure a plurality of cell currents flowing through a plurality of memory cells of all blocks.

13. The system according to claim 1, wherein the memory cell is set to an erasure state prior to degradation judgment.

14. The system according to claim 1, wherein the state machine is configured to measure the cell current of all the plurality of memory cells in the first block.

* * * * *